(12) United States Patent
Matsuzaki et al.

(10) Patent No.: US 11,689,829 B2
(45) Date of Patent: Jun. 27, 2023

(54) COMPARISON CIRCUIT, SEMICONDUCTOR DEVICE, ELECTRONIC COMPONENT, AND ELECTRONIC DEVICE

(71) Applicant: SEMICONDUCTOR ENERGY LABORATORY CO., LTD., Atsugi (JP)

(72) Inventors: Takanori Matsuzaki, Kanagawa (JP); Kiyoshi Kato, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/739,726

(22) Filed: May 9, 2022

(65) Prior Publication Data

US 2022/0264044 A1 Aug. 18, 2022

Related U.S. Application Data

(63) Continuation of application No. 16/616,181, filed as application No. PCT/IB2018/053590 on May 22, 2018, now Pat. No. 11,457,167.

(30) Foreign Application Priority Data

May 31, 2017 (JP) .................................. 2017-107964

(51) Int. Cl.
  *H04N 25/75* (2023.01)
  *H01L 27/146* (2006.01)
  (Continued)

(52) U.S. Cl.
  CPC ......... *H04N 25/75* (2023.01); *H01L 27/1225* (2013.01); *H01L 27/146* (2013.01); *H03K 5/249* (2013.01); *H04N 25/772* (2023.01)

(58) Field of Classification Search
  CPC .... H04N 5/378; H04N 5/37455; H04N 25/75; H04N 25/772; H01L 27/1225;
  (Continued)

(56) References Cited

U.S. PATENT DOCUMENTS

| | | |
|---|---|---|
| 5,146,112 A | 9/1992 | Ito et al. |
| 6,069,518 A | 5/2000 | Nakai et al. |

(Continued)

FOREIGN PATENT DOCUMENTS

| | | |
|---|---|---|
| CN | 001467747 A | 1/2004 |
| CN | 001540870 A | 10/2004 |

(Continued)

OTHER PUBLICATIONS

Taiwanese Office Action (Application No. 110121763) dated Apr. 26, 2022.

(Continued)

*Primary Examiner* — Nelson D. Hernández Hernández
(74) *Attorney, Agent, or Firm* — Fish & Richardson P.C.

(57) ABSTRACT

Provided is a comparison circuit to which a negative voltage to be compared can be input directly. The comparison circuit includes a first input terminal, a second input terminal, a first output terminal, and a differential pair. The comparison circuit compares a negative voltage and a negative reference voltage and outputs a first output voltage from the first output terminal in response to the comparison result. The negative voltage is input to the first input terminal. A positive reference voltage is input to the second input terminal. The positive reference voltage is determined so that comparison is performed. The differential pair includes a first n-channel transistor and a second n-channel transistor each having a gate and a backgate. The first input terminal is electrically connected to the backgate of the first n-chan- (Continued)

nel transistor. The second input terminal is electrically connected to the gate of the second n-channel transistor.

9 Claims, 25 Drawing Sheets

(51) Int. Cl.
*H01L 27/12* (2006.01)
*H03K 5/24* (2006.01)
*H04N 25/772* (2023.01)

(58) Field of Classification Search
CPC ............... H01L 27/146; H01L 27/0688; H01L 27/1104; H01L 27/10805; H01L 29/78648; H01L 29/7869; H03K 5/249; H02M 3/07; H02M 3/078
See application file for complete search history.

(56) References Cited

U.S. PATENT DOCUMENTS

| | | | |
|---|---|---|---|
| 6,204,721 B1 | 3/2001 | Yuen et al. | |
| 6,229,379 B1 | 5/2001 | Okamoto | |
| 6,337,593 B1 | 1/2002 | Mizuno et al. | |
| 6,452,448 B1 | 9/2002 | Bonaccio et al. | |
| 6,768,689 B2 | 7/2004 | Origasa | |
| 7,081,785 B2 | 7/2006 | Mori et al. | |
| 7,675,363 B2 | 3/2010 | Deguchi et al. | |
| 7,903,017 B2 | 3/2011 | Hsieh et al. | |
| 8,198,921 B2 | 6/2012 | Chen et al. | |
| 8,922,182 B2 | 12/2014 | Takahashi et al. | |
| 9,270,173 B2 | 2/2016 | Takahashi et al. | |
| 9,325,304 B2 | 4/2016 | Wang | |
| 9,391,598 B2 | 7/2016 | Inoue et al. | |
| 10,250,247 B2 | 4/2019 | Kato et al. | |
| 11,457,167 B2 * | 9/2022 | Matsuzaki | H04N 5/378 |
| 2004/0263230 A1 | 12/2004 | Mori et al. | |
| 2006/0202721 A1 * | 9/2006 | Partow | H03K 5/003 |
| | | | 327/65 |
| 2008/0303592 A1 * | 12/2008 | Deguchi | H03F 3/45659 |
| | | | 330/252 |
| 2012/0051118 A1 | 3/2012 | Yamazaki et al. | |
| 2013/0241515 A1 | 9/2013 | Yamashiro et al. | |
| 2016/0094236 A1 | 3/2016 | Shionoiri et al. | |
| 2016/0126909 A1 | 5/2016 | Vashishtha et al. | |
| 2017/0230041 A1 | 8/2017 | Kato et al. | |
| 2017/0302271 A1 | 10/2017 | Kato et al. | |
| 2019/0222209 A1 | 7/2019 | Kato et al. | |

FOREIGN PATENT DOCUMENTS

| | | |
|---|---|---|
| EP | 1471646 A | 10/2004 |
| JP | 60-012816 A | 1/1985 |
| JP | 05-180876 A | 7/1993 |
| JP | 07-231647 A | 8/1995 |
| JP | 11-150230 A | 6/1999 |
| JP | 11-191611 A | 7/1999 |
| JP | 2003-273711 A | 9/2003 |
| JP | 2004-328360 A | 11/2004 |
| JP | 2011-139627 A | 7/2011 |
| JP | 2012-069932 A | 4/2012 |
| JP | 2012-227588 A | 11/2012 |
| JP | 2016-187123 A | 10/2016 |
| JP | 2017-192124 A | 10/2017 |
| TW | 200908545 | 2/2009 |
| TW | I382669 | 1/2013 |
| TW | I405415 | 8/2013 |
| WO | WO-1999/007067 | 2/1999 |
| WO | WO-2011/068025 | 6/2011 |

OTHER PUBLICATIONS

International Search Report (Application No. PCT/IB2018/053590) dated Aug. 21, 2018.

Written Opinion (Application No. PCT/IB2018/053590) dated Aug. 21, 2018.

Onuki.T et al., "Embedded Memory and ARM Cortex-M0 Core Using 60-nm C-Axis Aligned Crystalline Indium-Gallium-Zinc Oxide FET Integrated with 65-nm Si CMOS", 2016 Symposium on VLSI Circuits Digest of Technical Papers, Jun. 15, 2016, pp. 124-125.

Jaworski.Z, "A 10 Gs/s latched comparator witch dynamic offset cancellation in 28nm FD-SOI process", Proceedings of SPIE—Electron Technology Conference 2016, Dec. 22, 2016, vol. 10175, pp. 101750A-1-101750A-7.

Chinese Office Action (Application No. 201880033269.6) dated Mar. 29, 2023.

* cited by examiner

COMPARISON CIRCUIT, SEMICONDUCTOR DEVICE, ELECTRONIC COMPONENT, AND ELECTRONIC DEVICE

CROSS REFERENCE TO RELATED APPLICATIONS

This application is a continuation of U.S. application Ser. No. 16/616,181, filed Nov. 22, 2019, now allowed, which is a U.S. National Phase Application under 35 U.S.C. § 371 of International Application PCT/IB2018/053590, filed on May 22, 2018, which claims the benefit of a foreign priority application filed in Japan as Application No. 2017-107964, on May 31, 2017, all of which are incorporated by reference.

TECHNICAL FIELD

One embodiment of the present invention disclosed in the specification, drawings, and scope of claims of this application (hereinafter referred to as this specification and the like) relates to a semiconductor device, an operation method thereof, a usage method thereof, a manufacturing method thereof, and the like. Note that one embodiment of the present invention is not limited to the above technical field.

BACKGROUND ART

A semiconductor device using a negative voltage is known. For example, in order to reduce subthreshold leakage current, a substrate bias voltage in an n-channel MOS transistor is a negative voltage, whereas a substrate bias voltage in a p-channel MOS transistor is a positive voltage (e.g., Patent Document 1). In a flash memory, a negative voltage is used depending on the operation (e.g., Patent Document 2).

A negative potential can be generated by a charge pump circuit. Patent Documents 2 and 3 disclose a technique for generating negative potentials with high accuracy. In Patent Documents 2 and 3, a negative voltage output from a charge pump circuit is converted into a positive voltage, the difference between the positive voltage and a positive reference voltage is detected by a comparator circuit, and the operation of the charge pump circuit is controlled on the basis of the detection results.

Note that in this specification and the like, the ground voltage (GND) is regarded as 0 V, and the positive voltage and negative voltage are defined on the basis of the ground voltage.

A transistor including a metal oxide in a channel formation region (hereinafter, such a transistor may be referred to as an oxide semiconductor transistor or an OS transistor) is known. A variety of semiconductor devices has been fabricated using a CMOS process for a hybrid of an OS transistor and a Si transistor (e.g., Non-Patent Document 1). As disclosed in Non-Patent Document 1, an OS transistor can be stacked over a Si transistor.

A Si transistor can control the threshold voltage (hereinafter, referred to as Vt in some cases) by impurity introduction. However, reliable technology for controlling the threshold voltage of an OS transistor has not yet been established. In Patent Document 4, for example, the threshold voltage of an OS transistor including a first gate electrode (also referred to as a gate or a front gate) and a second gate electrode (also referred to as a backgate) is controlled by controlling the voltage of the second gate electrode. The threshold voltage of the OS transistor which is an n-channel transistor shifts positively when a negative voltage is input to the second gate electrode.

REFERENCES

Patent Documents

[Patent Document 1] Japanese Published Patent Application No. H11-191611
[Patent Document 2] Japanese Published Patent Application No. H7-231647
[Patent Document 3] Japanese Published Patent Application No. H11-150230
[Patent Document 4] Japanese Published Patent Application No. 2012-069932

Non-Patent Document

[Non-Patent Document 1] T. Onuki et al., "Embedded Memory and ARM Cortex-M0 Core Using 60-nm C-Axis Aligned Crystalline Indium-Gallium-Zinc Oxide FET Integrated with 65-nm Si CMOS," Symp. VLSI Circuits Dig. Tech. Papers, pp. 124-125, June 2016.

DISCLOSURE OF INVENTION

Objects of one embodiment of the present invention are to provide a comparison circuit to which a negative voltage to be compared can be input directly, to generate a negative voltage with high accuracy, to reduce power consumption, and the like.

Note that one embodiment of the present invention does not necessarily achieve all the objects described above. The description of a plurality of objects does not disturb the existence of each object. Other objects will be apparent from the description of this specification and the like, and such objects could be objects of one embodiment of the present invention.

(1) One embodiment of the present invention is a comparison circuit including a first input terminal, a second input terminal, a first output terminal, and a differential input circuit. The comparison circuit compares a negative voltage and a negative reference voltage and outputs a first output voltage from the first output terminal in response to the comparison result. The negative voltage is input to the first input terminal. A positive reference voltage is input to the second input terminal. The positive reference voltage is determined so that comparison is performed. The differential input circuit includes a differential pair of a first n-channel transistor and a second n-channel transistor. The first n-channel transistor and the second re-channel transistor each have a gate and a backgate. A first bias voltage is input to the gate of the first n-channel transistor. The first input terminal is electrically connected to the backgate of the first n-channel transistor. The second input terminal is electrically connected to the gate of the second n-channel transistor. A second bias voltage is input to the backgate of the second n-channel transistor.

(2) In the embodiment (1), a channel formation region of each of the first n-channel transistor and the second n-channel transistor includes a metal oxide.

(3) The comparison circuit according to the embodiment (1) or (2) is a dynamic comparison circuit. The differential input circuit includes a latch circuit electrically connected to the differential pair.

(4) One embodiment of the present invention is a semiconductor device including a step-down charge pump circuit, a driver circuit, and the comparison circuit according to any one of the embodiments (1) to (3). An output terminal of the step-down charge pump circuit is electrically connected to the first input terminal of the comparison circuit. The first output voltage is input from the comparison circuit to the driver circuit. The driver circuit generates a clock signal for driving the step-down charge pump circuit in accordance with the first output voltage.

According to one embodiment of the present invention, a comparison circuit to which a negative voltage to be compared can be input directly can be provided. In addition, a negative voltage can be generated with high accuracy. In addition, power consumption can be reduced.

In one embodiment of the present invention, there is no need to obtain all the effects described above. The description of the plurality of effects does not preclude the existence of other effects. In one embodiment of the present invention, an object other than the above objects, an effect other than the above effects, and a novel feature will be apparent from the description of the specification and the drawings.

BEST MODE FOR CARRYING OUT THE INVENTION

Figure 1A:
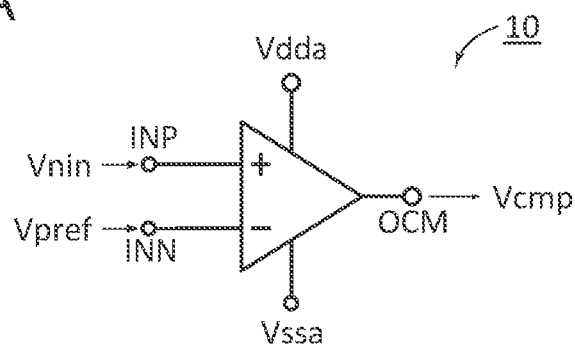
FIGS. 1A and 1B are circuit diagrams illustrating a configuration example of a comparison circuit and FIG. 1C is a diagram schematically showing drain current—gate voltage characteristics of a transistor.

Hereinafter, embodiments of the present invention are described. Note that one embodiment of the present invention is not limited to the following description. It will be readily appreciated by those skilled in the art that modes and details of the present invention can be modified in various ways without departing from the spirit and scope of the present invention. Therefore, one embodiment of the present invention should not be construed as being limited to the description in the following embodiments.

Any of the embodiments described below can be combined as appropriate. In the case where some structure examples (including a manufacturing method example, an operating method example, and the like) are given in one embodiment, any of the structure examples can be combined with each other as appropriate or combined with one or more structure examples described in the other embodiments as appropriate.

In this specification and the like, ordinal numbers such as "first," "second," and "third" are used to avoid confusion among components, and the terms do not limit the components numerically or do not limit the order.

The same components, components having similar functions, components formed using the same material, components formed at the same time, and the like in the drawings are denoted by the same reference numerals, and the description thereof is not repeated in some cases.

When a plurality of components denoted by the same reference numerals need to be distinguished from each other, "_1", "_2", "[n]", "[m, n]", or the like is sometimes added to the reference numerals.

In this specification, a power supply voltage VDD may be abbreviated to a "voltage VDD" or "VDD", for example. The same applies to other components (e.g., a signal, a voltage, a circuit, an element, an electrode, and a wiring).

In the drawings, the size, the layer thickness, the region, and the like are exaggerated for clarity in some cases. Therefore, the size, the layer thickness, or the region is not limited to the illustrated scale. The drawings are schematic views showing ideal examples, and embodiments of the present invention are not limited to shapes or values shown in the drawings. For example, the following can be included: variation in signal, voltage, or current due to noise or difference in timing.

In this specification, terms for describing arrangement, such as "over", "above", "under", and "below" are used for convenience to describe the positional relationship between components with reference to drawings in some cases. Further, the positional relation between components is changed as appropriate in accordance with a direction in which each component is described. Thus, there is no limitation on terms used in this specification, and description can be made appropriately depending on the situation.

Note that a transistor includes three terminals: a gate, a source, and a drain. A gate functions as a control terminal that controls the conduction state of a transistor. Depending on the type of the transistor or levels of potentials supplied to the terminals, one of two input/output terminals functions as a source and the other functions as a drain. Therefore, the terms "source" and "drain" can be switched in this specification and the like. In this specification and the like, the two terminals other than the gate may be referred to as a first terminal and a second terminal.

A node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In this specification and the like, the terms "film" and "layer" can be interchanged depending on the case or circumstances. For example, the term "conductive layer" can be changed into the term "conductive film" in some cases. The term "insulating film" can be changed into the term "insulating layer" in some cases, for example.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit and a chip including an integrated circuit are examples of semiconductor devices. Moreover, a storage device, a display device, a light-emitting device, a lighting device, an electronic device, and the like themselves might be semiconductor devices, or might each include a semiconductor device.

Embodiment 1

In this embodiment, a comparison circuit to which a negative voltage to be compared can be input directly and a semiconductor device including the comparison circuit are described.

<<Comparison Circuit>>

Here, a configuration example of a comparison circuit using a differential amplifier circuit is described.

FIG. 1A illustrates an example of a comparison circuit. A comparison circuit 10 illustrated in FIG. 1A includes terminals INN, INP, and OCM. The terminals INN, INP, and OCM are an inverting input terminal, a non-inverting input terminal, and an output terminal, respectively.

Voltages Vdda and Vssa are input to the comparison circuit 10. The voltage Vdda is a high-level-side power supply voltage. The voltage Vssa is a low-level-side power supply voltage, such as 0 V (ground voltage, GND).

The comparison circuit 10 has a function of comparing a negative voltage Vnin with a negative reference voltage Vnref and outputting a voltage Vcmp that corresponds to the comparison results from the terminal OCM. The negative voltage Vnin is input to the terminal INP. Not the negative reference voltage Vnref but a positive reference voltage Vpref is input to the terminal INN. The positive reference voltage Vpref corresponds to the negative reference voltage Vnref that is converted into a positive voltage. The value of the positive reference voltage Vpref is determined so that the comparison circuit 10 can carry out the comparison.

Figure 1B:
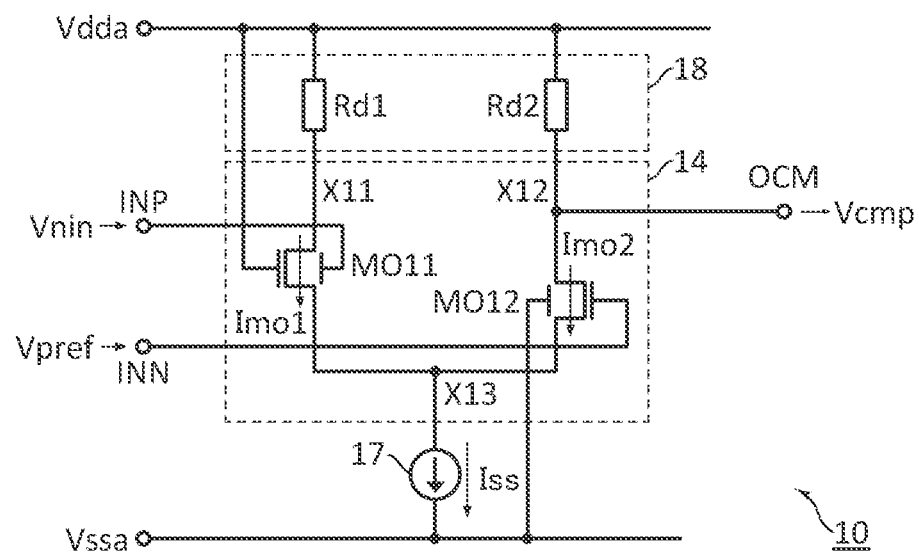

FIG. 1B illustrates a circuit configuration example of the comparison circuit 10. The comparison circuit 10 is composed of a differential circuit and includes a differential pair 14, a current source 17, and a load circuit 18.

The differential pair 14 includes transistors MO11 and MO12. Each of the transistors MO11 and MO12 is an OS transistor having a backgate. The backgate of the transistor MO11 is electrically connected to the terminal INP, and the voltage Vdda is input to the gate. The gate of the transistor MO12 is electrically connected to the terminal INN, and the voltage Vssa is input to the backgate.

Here, a connection node between the transistor MO11 and the load circuit 18 is referred to as a node X11, a connection node between the transistor MO12 and the load circuit 18 is referred to as a node X12, and a connection node between the transistor MO11 and the transistor MO12 is referred to as a node X13. The current source 17 supplies a current Iss to the node X13. The load circuit 18 applies loads Rd1 and Rd2 to the nodes X11 and X12, respectively.

Note that in the drawings, the n-channel transistor having a backgate is an OS transistor, and the p-channel transistor and the n-channel transistor having no backgate are Si transistors unless otherwise specified.

The voltage of each of the nodes X12 and X11 is determined by a difference between a drain current (Imo1) of the transistor MO11 and a drain current (Imo2) of the transistor MO12. In the example of FIG. 1B where the terminal OCM is electrically connected to the node X12, the voltage Vcmp is at the high level ("H") when Imo1>Imo2, whereas the voltage Vcmp is at the low level ("L") when Imo1<Imo2.

(Example of Setting Positive Reference Voltage Vpref)

A difference between the current Imo1 and the current Imo2 flowing through the differential pair 14 can be converted into a voltage difference between the terminal INP and the terminal INN. The positive reference voltage Vpref can thus be set in accordance with the voltage difference. Specifically, in the case where the voltage of the terminal INP, the gate voltage of the transistor MO11, and the backgate voltage of the transistor MO12 are Vnref, Vdda, and Vssa, respectively, a voltage difference between the terminal INP and the terminal INN when the difference between Imo1 and Imo2 is 0 ampere is estimated. The value of the positive reference voltage Vpref can be set from the estimated voltage difference.

With the positive reference voltage Vpref set in this manner, the terminal OCM outputs the voltage Vcmp at "H" when Vnin>Vnref, whereas the terminal OCM outputs the voltage Vcmp at "L" when Vnin<Vnref.

Figure 1C:
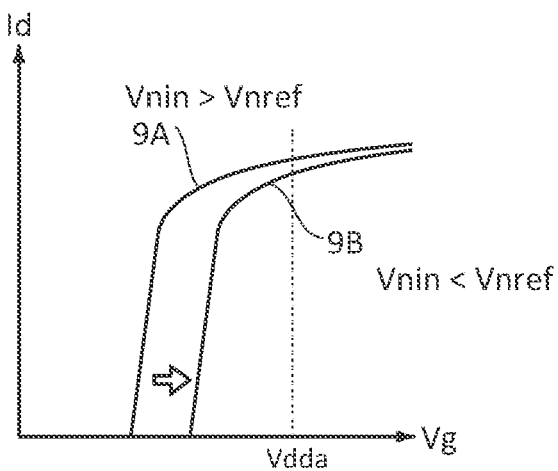

The operation principle of the comparison circuit 10 is described with reference to FIG. 1C. FIG. 1C schematically shows drain current-gate voltage (Id-Vg) characteristics of the transistor MO11. A curve 9A is the Id-Vg curve when Vnin>Vnref. A curve 9B is the Id-Vg curve when Vnin<Vnref.

When Vnin>Vnref, Imo1>Imo2 and thus the voltage Vcmp is at "H".

A decrease of the backgate voltage shifts Vt of the transistor MO11 positively. In other words, a decrease of the negative voltage Vnin reduces the current Imo1. When Vnin<Vnref, Imo1<Imo2 and thus the voltage Vcmp is at "L".

Next, modification examples of the differential pair are described. In the example of FIG. 1A, the voltages Vdda and Vssa are used as bias voltages of the differential pair 14, but bias voltages are not limited to these. The use of the voltages Vdda and Vssa as the bias voltages of the differential pair 14 can reduce the variety of voltages used in the comparison circuit 10.

Alternatively, the backgate of the transistor MO12 may be electrically connected to the terminal INP, and a bias voltage such as the voltage Vssa is input to the gate.

Figure 2:
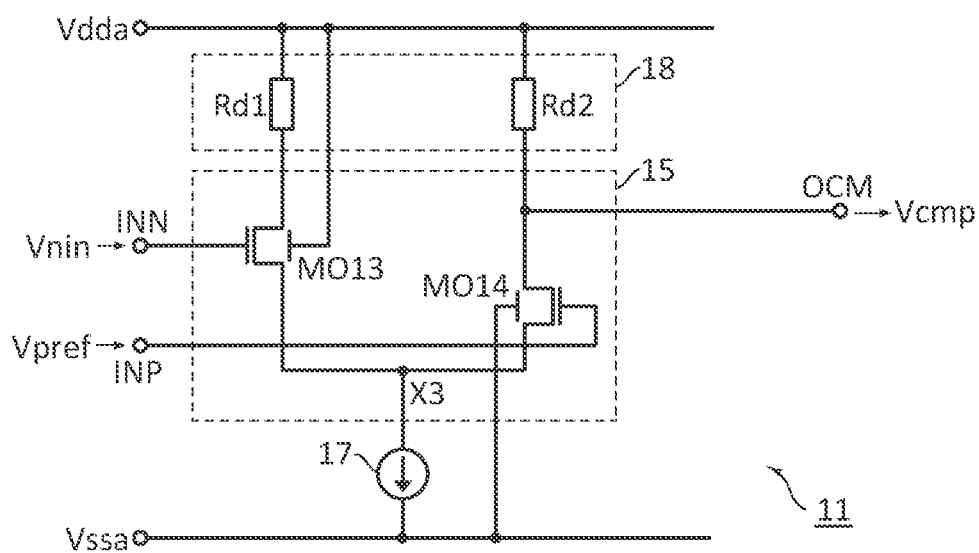
FIG. 2 is a circuit diagram illustrating a configuration example of a comparator circuit.

A comparison circuit 11 illustrated in FIG. 2 includes a differential pair 15 instead of the differential pair 14. The differential pair 15 includes transistors MO13 and MO14. The terminal INN is electrically connected to a gate of the transistor MO13. The terminal INP is electrically connected to a gate of the transistor MO14. A bias voltage (Vdda, here) is input to a backgate of the transistor MO13. A bias voltage (Vssa, here) is input to a backgate of the transistor MO14.

The backgate of the transistor MO14 may be electrically connected to the terminal INP, and a bias voltage (e.g., Vssa) is input to the gate.

The comparison circuit 10 can directly input a negative voltage to be compared without a complex circuit configuration. By converting a negative reference voltage into a positive reference voltage, only 0 V or a positive voltage is input to the comparison circuit 10 except the negative voltage (Vnin) to be compared, which leads to stable operation of the comparison circuit 10. The same applies to the comparison circuit 11.

<Comparison Circuits 20 to 25>

Next, specific examples of a circuit configuration of the comparison circuit are described.

Figure 3A:
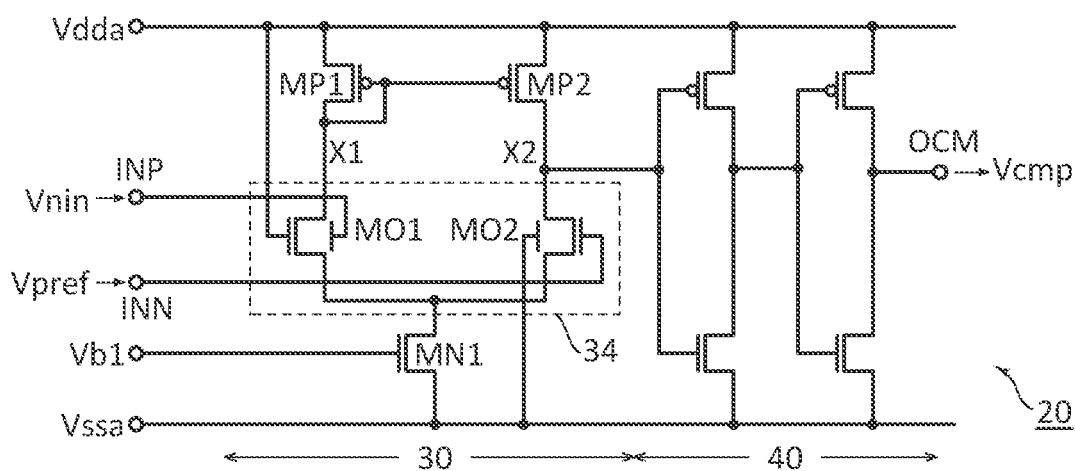
FIGS. 3A and 3B are circuit diagrams illustrating a configuration example of a comparison circuit.

A comparison circuit 20 illustrated in FIG. 3A includes the terminals INN, INP, and OCM, a differential input circuit 30, and an output circuit 40.

The differential input circuit 30 is a one-stage differential amplifier circuit and includes a differential pair 34 and transistors MN1, MP1, and MP2.

The differential pair 34 has the same circuit configuration as that of the differential pair 14 and includes transistors MO1 and MO2. A connection node between the transistors MO1 and MP1 is referred to as a node X1. A connection node between the transistors MO2 and MP2 is referred to as a node X2.

The terminal INP is electrically connected to a backgate of the transistor MO1. The terminal INN is electrically connected to a gate of the transistor MO2. The voltage Vdda is input to a gate of the transistor MO1. The voltage Vssa is input to a backgate of the transistor MO2.

The transistor MN1 serves as a current source. A voltage Vb1 is input to a gate of the transistor MN1. The voltage Vb1 is a positive voltage.

A current mirror circuit is composed of the transistors MP1 and MP2. The current mirror circuit serves as a load circuit. The load circuit may be composed of the transistors MP1 and MP2 which are diode-connected. Alternatively, two resistors may be provided instead of the transistors MP1 and MP2.

The output circuit 40 is electrically connected to the node X2. The output circuit 40 is composed of a two-stage CMOS inverter circuit. The CMOS inverter circuit is composed of Si transistors.

Figure 3B:
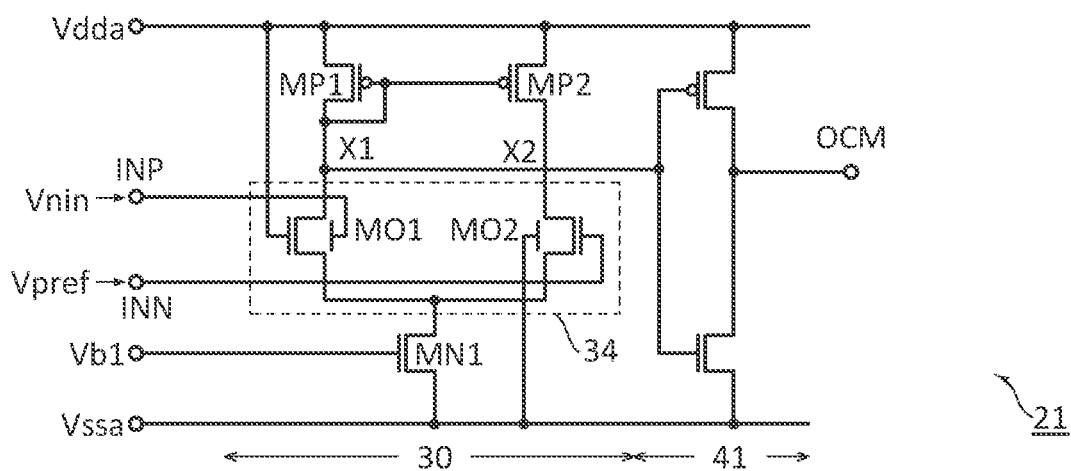

A comparison circuit 21 illustrated in FIG. 3B is a modification example of the comparison circuit 20. An output circuit 41 is composed of a one-stage CMOS inverter circuit. An input node of the CMOS inverter circuit is electrically connected to the node X1.

Figure 4A:
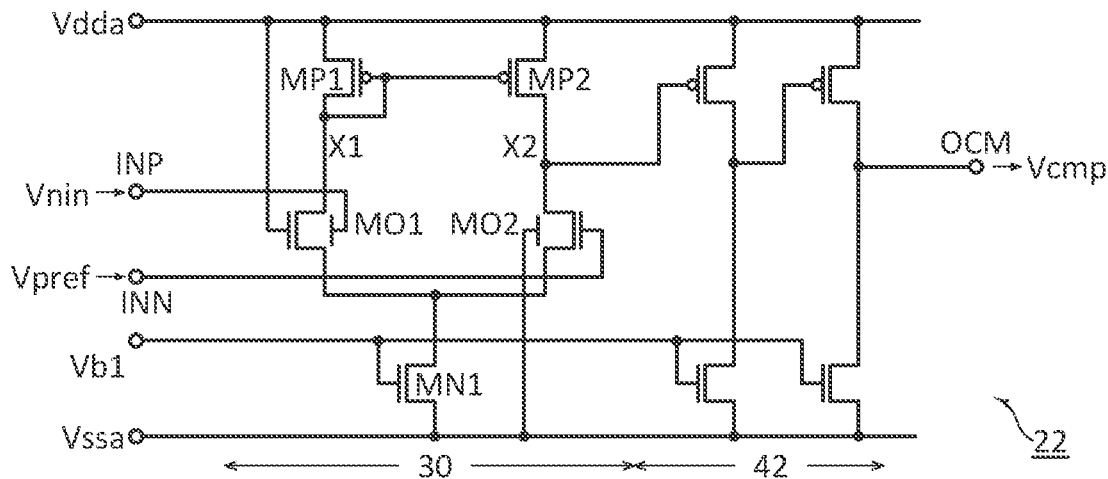
FIGS. 4A to 4C are circuit diagrams each showing a configuration example of a comparison circuit.
Figure 4B:
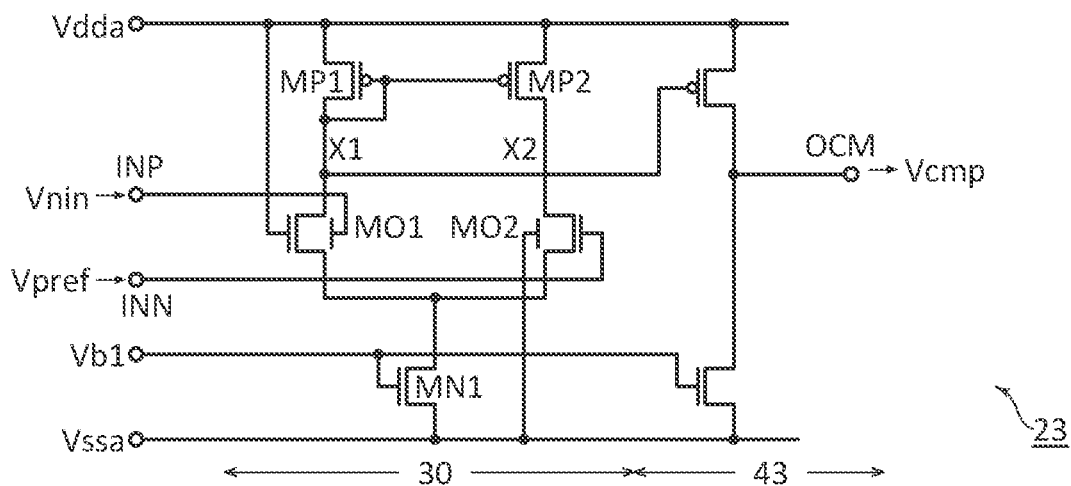

A comparison circuit 22 illustrated in FIG. 4A is a modification example of the comparison circuit 20. An output circuit 42 of the comparison circuit 22 is composed of a two-stage source follower circuit. A comparison circuit 23 illustrated in FIG. 4B is a modification example of the comparison circuit 22. An output circuit 43 of the comparison circuit 23 is composed of a one-stage source follower circuit. An input node of the source follow circuit is electrically connected to the node X1.

Figure 4C:
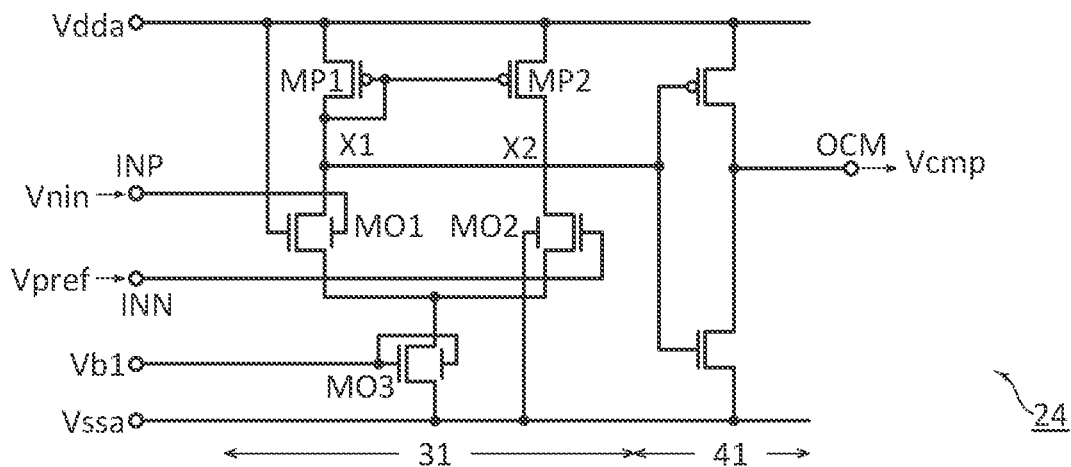

A comparison circuit 24 illustrated in FIG. 4C is a modification example of the comparison circuit 21 and includes a differential input circuit 31. The differential input circuit 31 is a modification example of the differential input circuit 30 and includes a transistor MO3 instead of the transistor MN1. The voltage Vb1 is input to a gate of the transistor MP3, and the backgate is electrically connected to the gate. Note that a bias voltage (e.g., the voltage Vssa) may be input to the backgate of the transistor MP3, and the backgate may be electrically connected to the drain.

The comparison circuits 20 to 24 output the voltage Vcmp at "H" when Vnin>Vnref and output the voltage Vcmp at "L" when Vnin<Vnref. The relationship between the magnitude relationship between Vnin and Vnref and the level of the voltage Vcmp is appropriately changed depending on the circuit configuration or the like of the output circuit.

In the comparison circuit 20, the terminal INP may be electrically connected to the gate of the transistor MO1, and a bias voltage (e.g., Vdda) may be input to the backgate of the transistor MO1. The terminal INN may be electrically connected to the backgate of the transistor MO2, and a bias voltage (e.g., Vssa) may be input to the gate of the transistor MO2. The same can apply to the comparison circuits 21 to 24.

<<Dynamic Comparison Circuit>>

A configuration example of the dynamic comparison circuit is described with reference to FIG. 5. A comparison circuit 25 illustrated in FIG. 5 includes a differential input circuit 32, an output circuit 45, the terminals INN, INP, and OCM, and a terminal OCMB. The voltages Vdda and Vssa and a clock signal CLK (hereinafter, referred to as a signal CLK) are input to the comparison circuit 25.

The comparison circuit 25 compares the negative voltage Vnin with the negative reference voltage Vnref and outputs the voltage Vcmp and a voltage VcmpB which correspond to the comparison results from the terminals OCM and OCMB. The negative voltage Vnin and the positive reference voltage Vpref are input to the terminals INN and INP, respectively. How the positive reference voltage Vpref is set is similar to that in the comparison circuit 10.

Currents Imo5 and Imo6 in the drawing mean drain currents of the transistors MO5 and MO6, respectively.

In the comparison circuit 25, the negative voltage (Vnin) to be compared can be input to the terminal INN, and a voltage of 0 V or lower can be used.

The differential input circuit 32 includes the transistors MO5 and MO6 and transistors MN5, MN6, MN7, MP5, MP6, MP7, and MP8.

A differential pair of the differential input circuit 32 has the same circuit configuration as that of the differential pair 34 and includes the transistors MO5 and MO6. The transistor MN7 serves as a current source. The signal CLK is input to a gate of the transistor MN7.

Here, a connection node between the transistors MN5 and MP5 is referred to as a node X5. A connection node between the transistors MN6 and MP6 is referred to as a node X6. A latch circuit is composed of the transistors MN5, MP5, MN6, and MP6. The latch circuit determines the voltage levels of the nodes X5 and X6 on the basis of the magnitude relationship between the currents Imo5 and Imo6.

The transistors MP7 and MP8 are reset transistors. The on/off of the transistors MP7 and MP8 is controlled by the signal CLK. When the transistors MP7 and MP8 are ON, the voltages of the nodes X5 and X6 are fixed at Vdda ("H").

The output circuit 45 includes inverter circuits 38 and 39. Input terminals of the inverter circuits 38 and 39 are electrically connected to the node X5 and X6, respectively. Output terminals of the inverter circuits 38 and 39 are electrically connected to the terminals OCM and OCMB, respectively.

In a period during which the signal CLK is at "L", the comparison circuit 25 performs precharging. Since the transistors MP7 and MP8 are ON, the nodes X5 and X6 are fixed at "H" and the terminals OCM and OCMB are fixed at "L".

In a period during which the signal CLK is at "H", the comparison circuit 25 performs evaluation. When a difference occurs between the currents Imo5 and Imo6, a difference occurs between the driving ability of the two inverter circuits included in the latch circuit, so that a voltage difference occurs between the nodes X5 and X6.

When Vnin>Vnref, the current Imo5> the current Imo6. Therefore, the voltage of the node X5 is lower than the voltage of the node X6, and the terminal OCM and the terminal OCMB are at "H" and "L", respectively. In contrast, when Vnin<Vnref, the current Imo5<the current Imo6. Therefore, the voltage of the node X5 is higher than the voltage of the node X6, and the terminal OCM and the terminal OCMB are at "L" and "H", respectively.

Since the differential pair in the comparison circuit 20 illustrated in FIG. 3A is formed with two OS transistors having backgates, the voltage Vssa can be the ground voltage. Thus, there is no need to input a negative voltage to the source of the transistor MN1.

When a negative voltage is input to a source of an n-channel Si transistor, a forward bias voltage is applied to a parasitic diode (a p-n junction diode) between a p-well and a source region. This causes backflow of large current from a substrate to the source region. In order to prevent the backflow of large current, a triple-well structure in which an n-channel transistor is surrounded by an n-well is generally employed (e.g., see FIG. 3b and FIG. 6 in Patent Document 3). However, the circuit area is increased due to the triple-well n-channel transistor.

The comparison circuit 20 can be formed without using a triple-well n-channel Si transistor and thus can be reduced in the circuit area. The same applies to the comparison circuits 21 to 25.

As described above, owing to the differential pair formed with two n-channel transistors having backgates, the comparison circuit in this embodiment can be supplied with a negative voltage to be compared, can use a reference voltage obtained by converting a negative reference voltage into a positive voltage, and can make a low-level-side power supply voltage 0 V (GND) without a complicated circuit configuration. The comparison circuit in this embodiment can thus perform a high-accuracy comparison between a negative voltage and a negative reference voltage and stable operation.

Embodiment 2

Described in this embodiment is a semiconductor device including the comparison circuit shown in Embodiment 1. A device for supplying a negative voltage to the semiconductor device is described as an example.

<<Negative Voltage Supply Device 100>>

Figure 6:
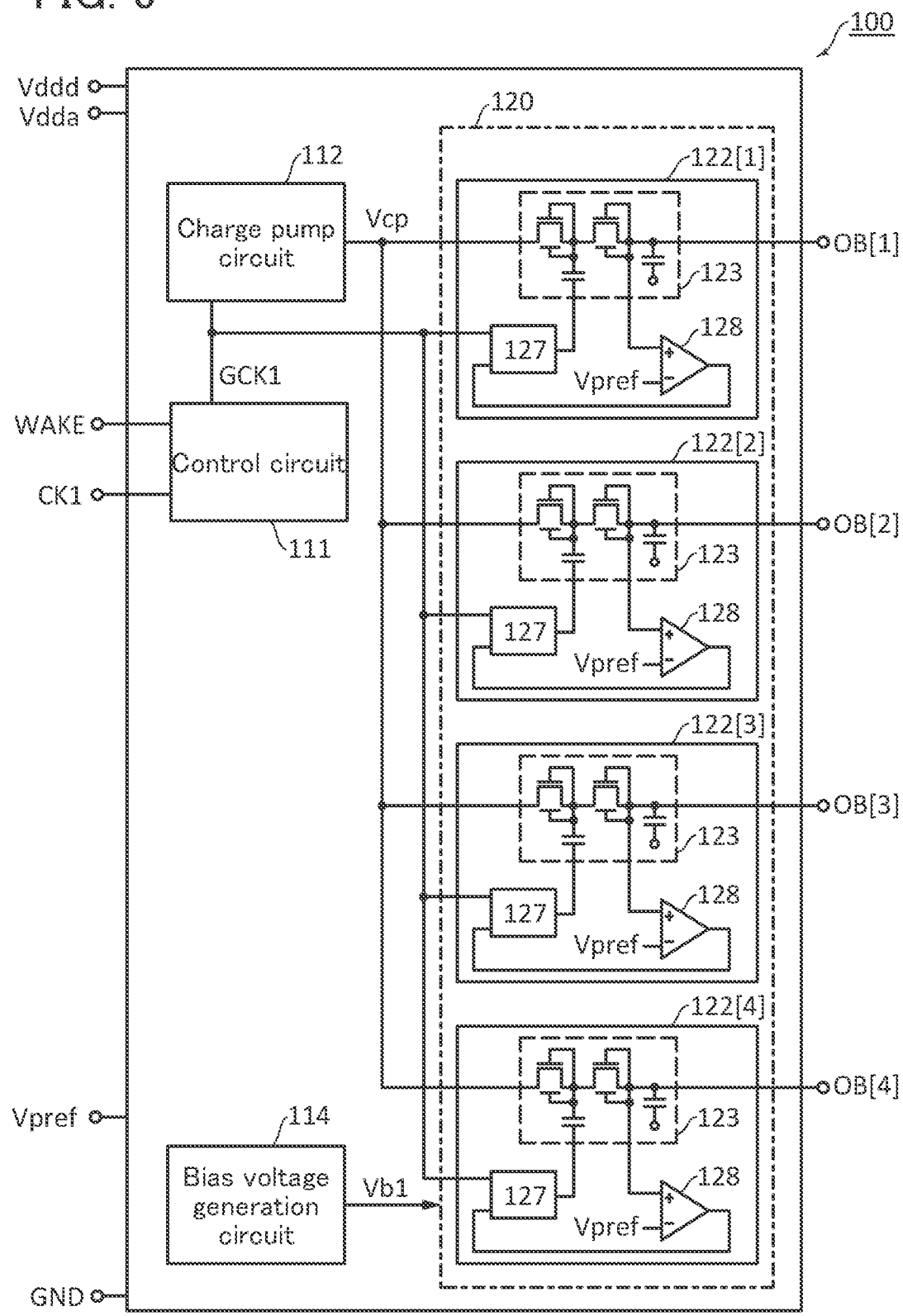
FIG. 6 is a block diagram illustrating a structure example of a negative voltage supply device.

FIG. 6 is a block diagram illustrating a structure example of a negative voltage supply device. A negative voltage supply device 100 illustrated in FIG. 6 internally generates a negative voltage and outputs the generated negative voltage to a plurality of power supply terminals. The negative voltage supply device 100 includes a control circuit 111, a charge pump circuit 112, a bias voltage generation circuit 114, an output voltage adjuster 120, and a plurality of terminals OB. The terminal OB is an output terminal for a negative voltage. The number of the terminals OB is four in this example but is not limited thereto.

In order to distinguish the four terminals OB, reference numerals [1] to [4] are used. When there is a need to specify any one of the plurality of terminals OB, the one is referred to as a terminal OB[1], for example. The term "terminal OB" refers to any given terminal OB. The same applies to other elements.

Voltages Vdda, Vddd, and GND, the positive reference voltage Vpref, a clock signal CK1, and a signal WAKE are input to the negative voltage supply device 100. Note that the voltage GND is 0 V (ground voltage) and used as a low-level-side power supply voltage of the negative voltage supply device 100. The voltage Vddd is a high-level-side power supply voltage and is lower than the voltage Vdda. The voltage Vddd is used in the control circuit 111.

<Control Circuit 111>

The signal WAKE serves as an enable signal of the negative voltage supply device 100. The control circuit 111 controls the charge pump circuit 112 and the output voltage adjuster 120 in accordance with the signal WAKE. The control circuit 111 serves as a gated clock buffer, here. The control circuit 111 generates a gated clock signal GCK1 (hereinafter, referred to as a clock signal GCK1) from the clock signal CK1 in accordance with the signal WAKE. The low-level voltage and the high-level voltage of the clock signal CK1 is GND and Vdda, respectively.

The clock signal GCK1 is input to each of the charge pump circuit 112 and the output voltage adjuster 120.

<Charge Pump Circuit 112>

Figure 7:
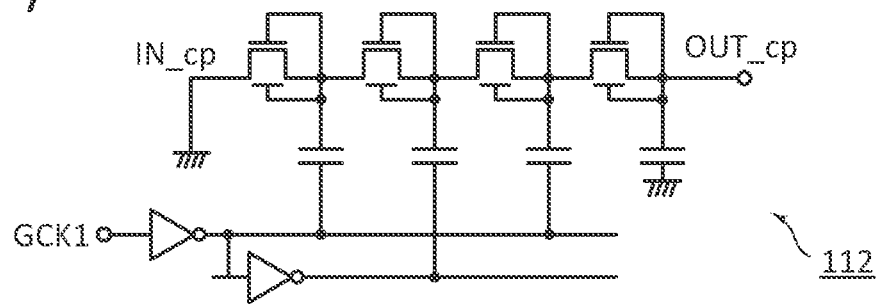
FIG. 7 is a circuit diagram illustrating a configuration example of a charge pump circuit.

The charge pump circuit 112 serves as a negative voltage generation circuit. FIG. 7 illustrates a circuit configuration example of the charge pump circuit 112, which is a four-stage step-down charge pump circuit. The charge pump circuit 112 includes terminals IN_cp and OUT_cp, two inverter circuits, four OS transistors, and four capacitors. When the clock signal GCK1 is active, the charge pump circuit 112 generates the negative voltage Vcp from the voltage GND that is input to the terminal IN_cp and outputs the negative voltage Vcp from the terminal OUT_cp.

In the example of FIG. 7, four transistors are provided in an electric charge transfer path between the terminals IN_cp and OUT_cp, but the number of transistors is not limited thereto. In addition, the transistor provided in the electric charge transfer path is not limited to an OS transistor. Other examples of a step-down charge pump circuit that can be used as the charge pump circuit 112 are illustrated in FIGS. 8A to 8C.

Figure 8A:
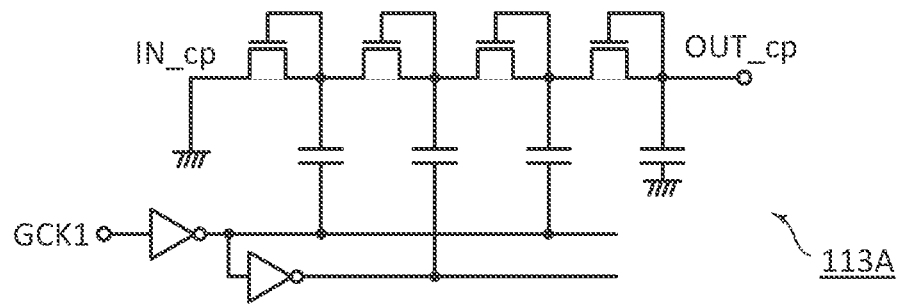
FIGS. 8A to 8C are circuit diagrams each illustrating a structure example of a charge pump circuit.
Figure 8B:
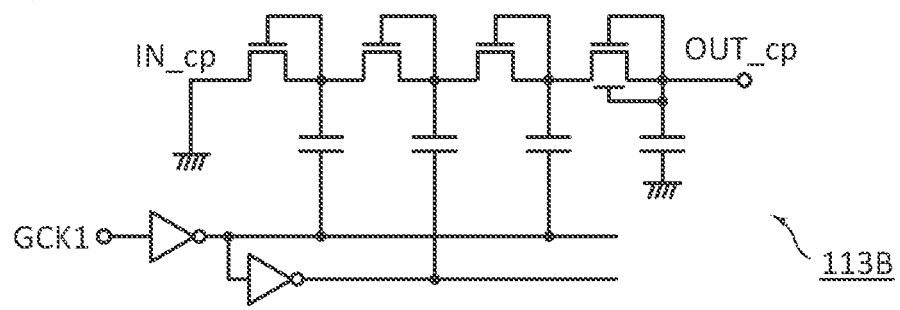
Figure 8C:
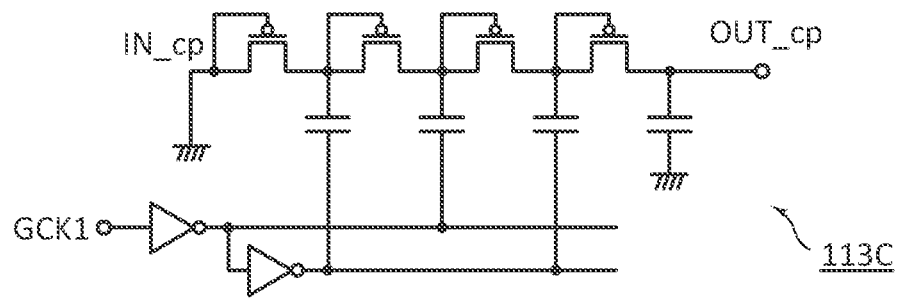

A charge pump circuit 113A in FIG. 8A includes two inverter circuits, four n-channel Si transistors, and four capacitors. A charge pump circuit 113B in FIG. 8B includes three re-channel Si transistors and one OS transistor. A charge pump circuit 113C in FIG. 8C includes two inverter circuits, four p-channel Si transistors, and four capacitors.

<Bias Voltage Generation Circuit 114>

The bias voltage generation circuit 114 generates the voltage Vb1. The voltage Vb1 is input to the output voltage adjuster 120. The voltage Vb1 may be input from the outside without the bias generation circuit 114.

<Output Voltage Adjuster 120>

Figures 9A, 9B:
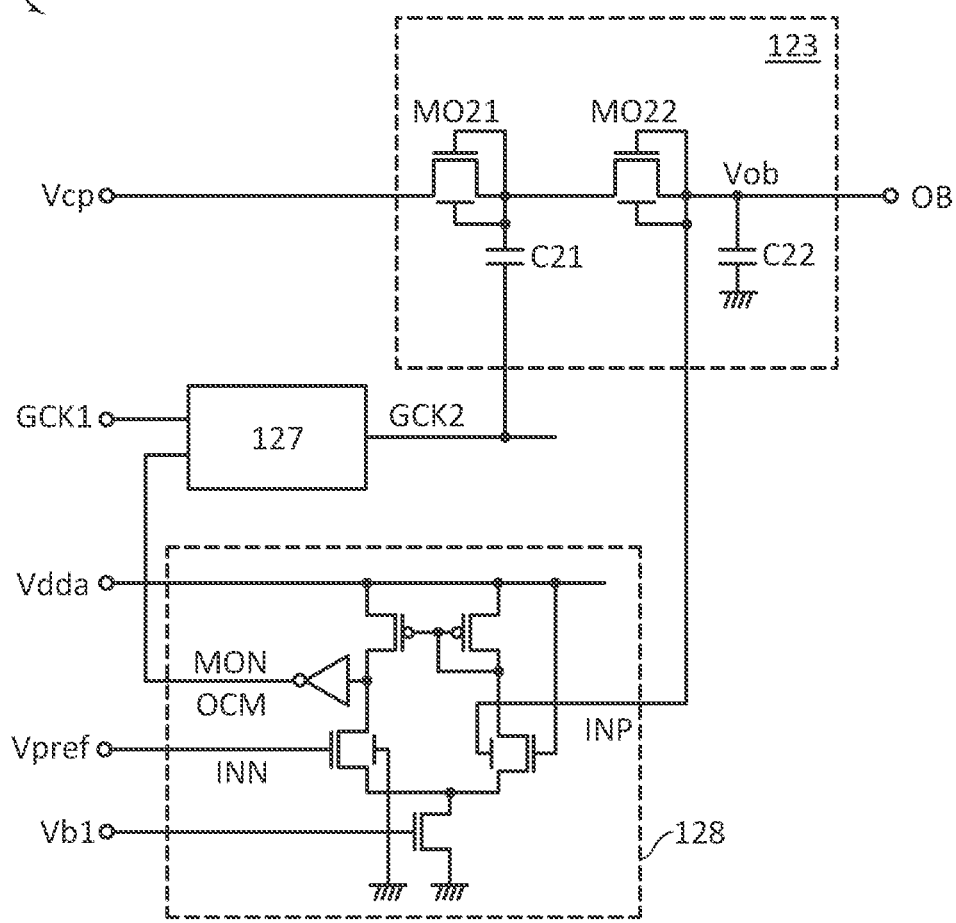
FIG. 9A is a circuit diagram illustrating a configuration example of a negative voltage holding circuit and FIG. 9B is a truth table of a driver circuit.

The output voltage adjuster 120 is provided to stably output a negative voltage from each of the terminals OB. The output voltage adjuster 120 includes four negative voltage holding circuits 122. The negative voltage holding circuit 122 includes a charge pump circuit 123, a driver circuit 127, and a monitor circuit 128. The negative voltage holding circuit 122[j] (j is an integer of 1 to 4) controls the output voltage of the terminal OB[j]. FIG. 9A illustrates a circuit configuration example of the negative voltage holding circuit 122.

<Negative Voltage Holding Circuit 122>

The charge pump circuit 123 includes transistors MO21 and MO22 and capacitors C21 and C22. The charge pump circuit 123 lowers the voltage Vcp to generate a voltage Vob. The voltage Vob is held by the capacitor C22. The voltage Vob is output from the terminal OB.

The capacitance of the capacitor C22 is preferably larger than that of the capacitor C21. For example, the capacitance of the capacitor C22 is two to ten times the capacitance of the capacitor C22. Depending on the capacitance required for the capacitor C21, the capacitor C21 can be formed with a parasitic capacitance of the transistor MO21 or a parasitic capacitance between the transistor MO21 and a wiring or the like.

A metal oxide semiconductor has a band gap of 2.5 eV or more; thus, the off-state current of an OS transistor is extremely small. For example, the off-state current per micrometer in channel width at room temperature (25° C.) and at a source-drain voltage of 3.5 V can be lower than $1 \times 10^{-20}$ A, lower than $1 \times 10^{-22}$ A, or lower than $1 \times 10^{-24}$ A. That is, the on/off ratio of drain current can be greater than or equal to 20 digits and less than or equal to 150 digits.

A metal oxide semiconductor is a semiconductor which has a large energy gap and in which electrons are unlikely to be excited and the effective mass of a hole is large.

Accordingly, an avalanche breakdown and the like are less likely to occur in an OS transistor than in a Si transistor. Since hot-carrier degradation or the like due to the avalanche breakdown is inhibited, the OS transistor has high withstand voltage between the source and drain.

Examples of a metal oxide that can be used in a channel formation region include Zn oxide, Zn—Sn oxide, Ga—Sn oxide, In—Ga oxide, In—Zn oxide, and In-M-Zn oxide (M is Ti, Ga, Y, Zr, La, Ce, Nd, Sn, or Hf). In addition, an oxide containing indium and zinc may contain one or more kinds of elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like.

A negative voltage is applied to a gate of the transistor MO22; thus, electrical connection of a backgate of the transistor MO22 to the gate is effective in reducing cutoff current of the transistor MO22. This is because the threshold voltage of the transistor MO22 shifts positively by electrically connecting the backgate to the gate of the transistor MO22. Note that the cutoff current refers to drain current when the transistor's gate-source voltage is 0 V.

Therefore, the fact that the transistors MO21 and MO22 are OS transistors having backgates is effective in stably supplying a negative voltage for a long time.

Since an OS transistor can be stacked over a Si transistor, the transistors MO21 and MO22, which are OS transistors, are effective in reducing the size of the negative voltage supply device 100.

The monitor circuit 128 monitors the voltage Vob of the terminal OB. The monitor circuit 128 is composed of a comparison circuit using a differential amplifier circuit. A comparison circuit illustrated in FIG. 9A is a modification example of the comparison circuit 20 (see FIG. 3A). Here, an output circuit includes one CMOS inverter circuit.

The terminal INP is electrically connected to the terminal OB. The positive reference voltage Vpref is input to the terminal INN. The terminal OCM is electrically connected to an input terminal of the driver circuit 127. A signal MON is the output of the terminal OCM.

An output voltage of the negative voltage supply device 100 is set to a negative voltage VBG. The monitor circuit 128 compares the voltage Vob with the negative voltage VBG used as the reference. The value of the positive reference voltage Vpref is set so that the monitor circuit 128 can perform the comparison.

Here, the monitor circuit 128 monitors the lowering of the voltage Vob. When the voltage Vob is higher than the negative voltage VBG, the monitor circuit 128 outputs the signal MON at "L". When the voltage Vob is lower than the negative voltage VBG, the monitor circuit 128 outputs the signal MON at "H".

A plurality of positive reference voltages may be used depending on variation in characteristics (e.g., offset voltage) between the plurality of monitor circuits 128. For example, two positive reference voltages Vpref1 and Vpref2 having different values from each other are input to the negative voltage supply device 100. The positive reference voltage Vpref1 is input to monitor circuits 128[1] and 128[2]. The positive reference voltage Vpref2 is input to monitor circuits 128[3] and 128[4].

The driver circuit 127 performs logic operation between the signal MON and the clock signal GCK1 and generates a clock signal GCK2 for driving the charge pump circuit 123. The driver circuit 127 has a circuit configuration in which the clock signal GCK2 is active when the signal MON is at "L" and the clock signal GCK2 is inactive in the other periods. FIG. 9B shows an example of a truth table of the driver circuit 127.

<<Operation Example>>

Figure 10:
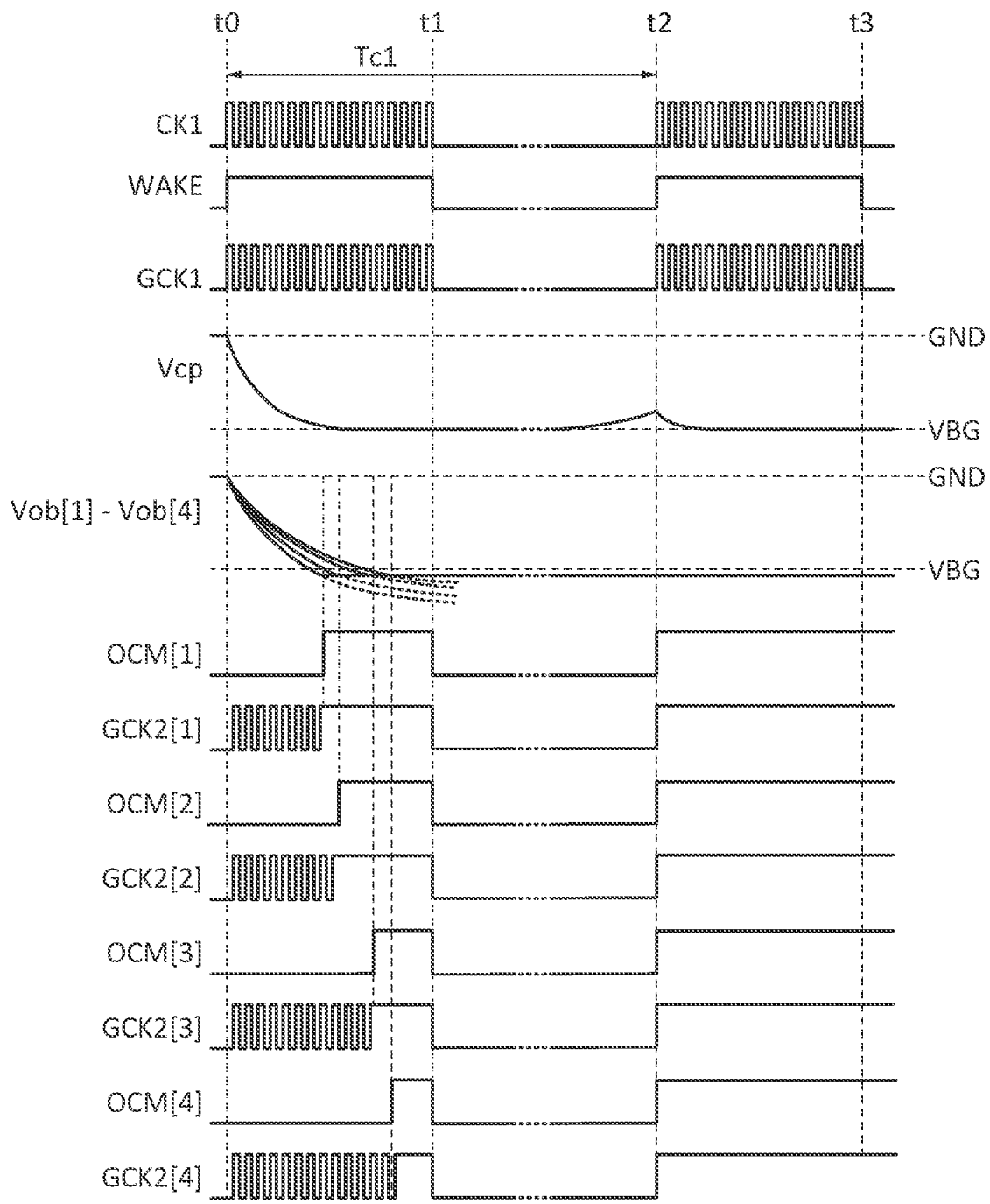
FIG. 10 is a timing chart showing an operation example of a negative voltage supply device.

An operation example of the negative voltage supply device 100 is described with reference to FIG. 10. FIG. 10 is a timing chart showing the operation example of the negative voltage supply device 100. Time is denoted by t0 and the like. Here, the output voltage Vcp of the charge pump circuit 112 and voltages Vob[1] to Vob[4] of the terminal OB[1] to OB[4] are 0 V (GND) at time t0.

A period Tc1 in FIG. 10 is one cycle period of operation of the negative voltage supply device 100. The signal WAKE serves as a chip enable signal of the negative voltage supply device 100. In a period during which the signal WAKE is at "H", the negative voltage supply device 100 is active.

In the period during which the signal WAKE is at "H", the clock signal GCK1 output from the control circuit 111 is active, and thus the charge pump circuit 112 performs step-down operation. Here, the output voltage Vcp of the charge pump circuit 112 is saturated at the negative voltage VBG from time t0 to time t1.

Since the voltage Vob[1] is GND at time t0, a signal MON[1] at "L" is output from the monitor circuit 128[1].

Signals MON[2] to MON[4] are also at "L". Thus, the driver circuits 127[1] to 127[4] output active clock signals GCK2 [1] to GCK2[4], respectively.

Since a charge pump circuit 123[1] performs step-down operation, the voltage Vob[1] is lowered. Charge pump circuits 123 [2] to 123 [4] also perform step-down operation.

Variation in electrical characteristics (e.g., threshold voltage) of the transistors MO21 and MO22 between the charge pump circuits 123[1] to 123[4] causes a difference in current driving ability between the charge pump circuits 123[1] to 123[4]. Thus, the terminals OB[1] to OB[4] reach the negative voltage VBG at different timings. In this embodiment, the monitor circuits 128[1] to 128[4] monitor the voltages of the terminals OB[1] to OB[4] independently, which can reduce variation in resulting voltages between the terminals OB[1] to OB[4] to make these voltages approximately the same as the negative voltage VBG.

For example, a negative voltage holding circuit 122[1] is described. When detecting that the voltage Vob[1] reaches the negative voltage VBG, the monitor circuit 128[1] outputs the signal MON[1] at "H" to the driver circuit 127[1]. In response to the input of the signal MON[1] at "H", the driver circuit 127[1] fixes the clock signal GCK2 at "H". As a result, the charge pump circuit 123[1] stops the step-down operation, and the voltage Vob[1] is set to approximately the negative voltage VBG.

Since a transistor MO22[1] is an OS transistor having extremely small off-state current, a capacitor C22[1] can hold the negative voltage VBG for a long time even if the clock signal GCK2 is inactive.

Negative voltage holding circuits 122[2] to 122[4] operate in the above manner, and voltages Vob[2] to Vob[4] are set to approximately the negative voltage VBG.

Since the signal WAKE is at "L" from time t1 to time t2, the negative voltage supply device 100 is inactive. Here, clock gating is performed to fix the clock signal CK1 at "L", whereby the standby power of the negative voltage supply device 100 is reduced.

Owing to excellent retention characteristics of the negative voltage holding circuit 122, a period during which the signal WAKE is at "L" can be longer. Thus, power-gating for stopping the supply of the power supply voltages (Vddd, Vdda) to the negative voltage supply device 100 can be performed in the period. The power-gating can further reduce power consumption of the negative voltage supply device 100.

FIG. 10 shows an example of performing power-gating in a period during which the signal WAKE is at "L". At time t2, the supply of the voltages Vddd and Vdda starts, the signal WAKE goes into "H", and the clock signal CK1 is activated. The operation of the negative voltage supply device 100 from time t2 to time t3 is similar to the operation from time t0 to time t1. In FIG. 10, the voltages Vob[1] to Vob[4] from time t1 to time t3 do not exceed the negative voltage VBG. When the monitor circuits 128[1] to 128[4] are activated, terminals OCM[1] to OCM[4] at "L" go "H". Therefore, the charge pump circuits 123[1] to 123[4] are on standby.

Since the negative voltage holding circuit 122 has the function of controlling step-down of the terminal OB and the function of holding the voltage of the terminal OB, the determined negative voltage can be stably output from the terminal OB for a long time.

<<Negative Voltage Supply Device 101>>

Another configuration example of the negative voltage supply device is described with reference to FIG. 11, FIG. 12, and FIGS. 13A and 13B. In the configuration example, a dynamic comparison circuit is used for a negative voltage monitor circuit.

Figure 11:
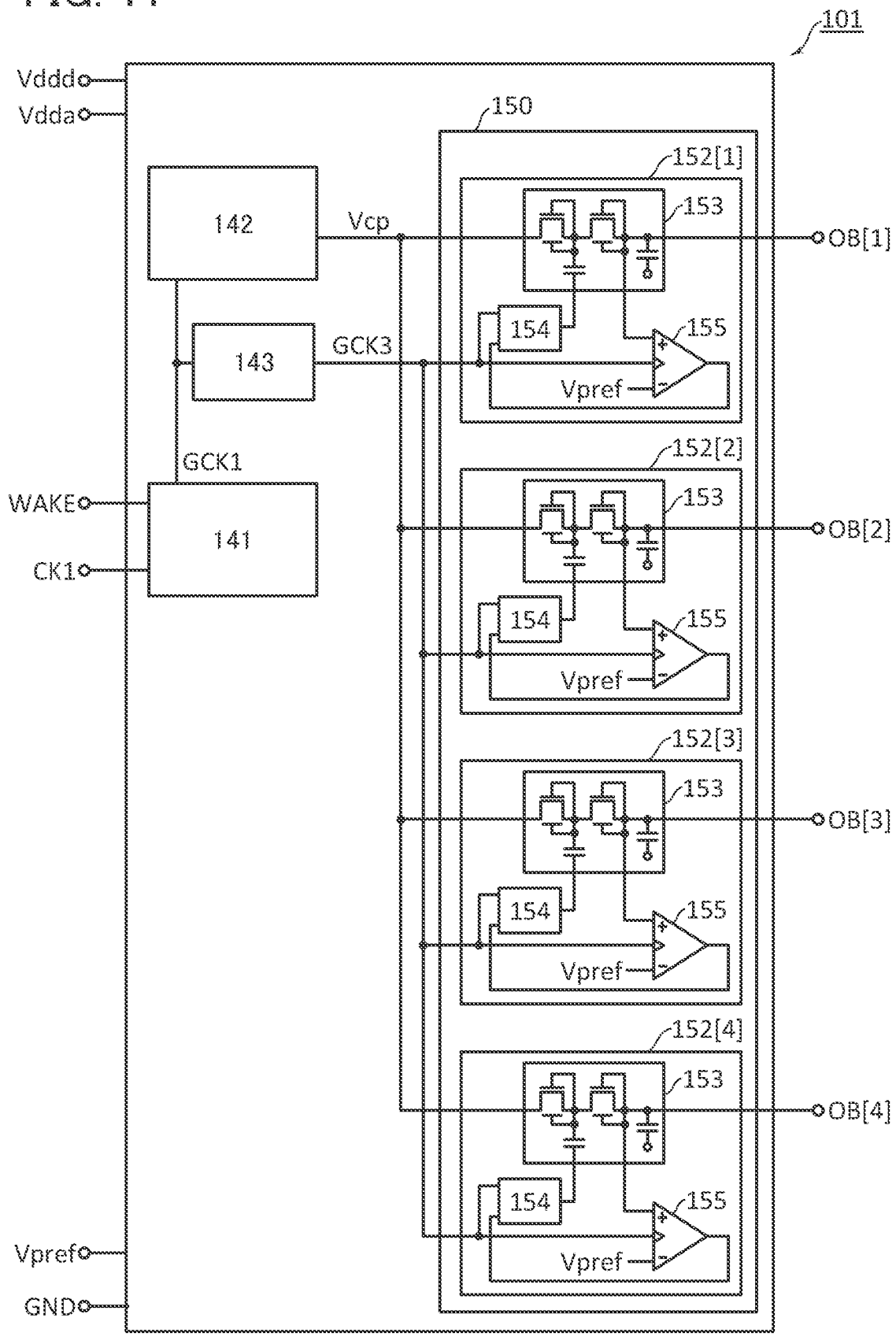
FIG. 11 is a block diagram illustrating a configuration example of a negative voltage supply device.

A negative voltage supply device 101 illustrated in FIG. 11 includes a control circuit 141, a charge pump circuit 142, a divider circuit 143, an output voltage adjuster 150, and four terminals OB. The output voltage adjuster 150 includes four negative voltage holding circuits 152.

The voltages Vdda, Vddd, and GND, the positive reference voltage Vpref, the clock signal CK1, and the signal WAKE are input to the negative voltage supply device 101.

The control circuit 141 has the same function as the control circuit 111. The control circuit 141 generates the clock signal GCK1 in accordance with the signal WAKE.

The charge pump circuit 142 has the same circuit configuration as the charge pump circuit 112 (see FIG. 7). The charge pump circuit 142 performs step-down operation in response to the clock signal GCK1 to output the voltage Vcp.

The divider circuit 143 performs frequency division on the clock signal GCK1 to generate a clock signal GCK3. The clock signal GCK3 is input to each of the four negative voltage holding circuits 152.

Figure 12:
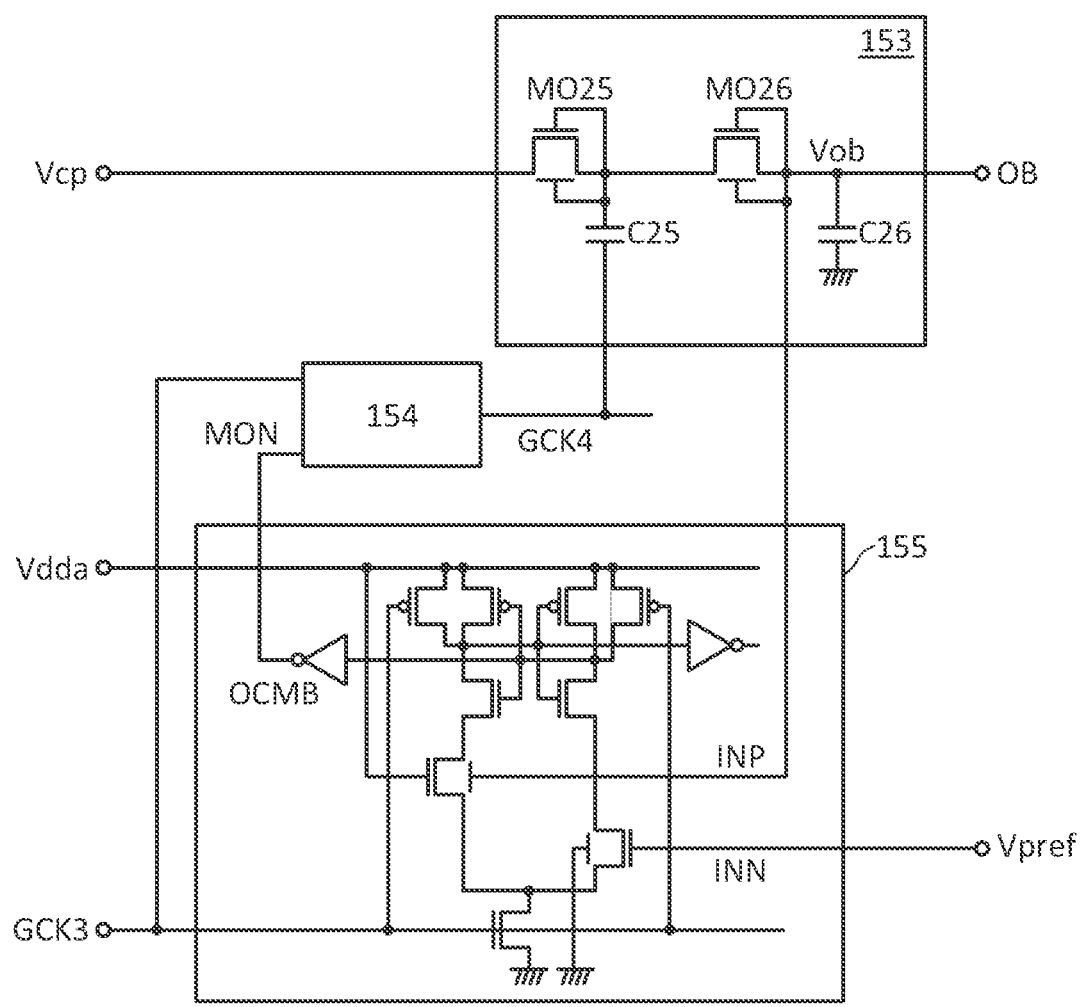
FIG. 12 is a circuit diagram illustrating a structure example of a negative voltage holding circuit.

FIG. 12 illustrates a circuit configuration example of the negative voltage holding circuit 152. The negative voltage holding circuit 152 includes a charge pump circuit 153, a driver circuit 154, and a monitor circuit 155.

The charge pump circuit 153 has the same circuit configuration as the charge pump circuit 123 and includes transistors MO25 and MO26 and capacitors C25 and C26.

The driver circuit 154 has a similar function to the driver circuit 127 (see FIG. 9B). The driver circuit 154 performs logic operation between the signal MON and the clock signal GCK3 and generates a clock signal GCK4 for driving the charge pump circuit 153. When the signal MON is at "L", the clock signal GCK4 is active. When the signal MON is not at "L", the clock signal GCK4 is inactive.

Figure 5:
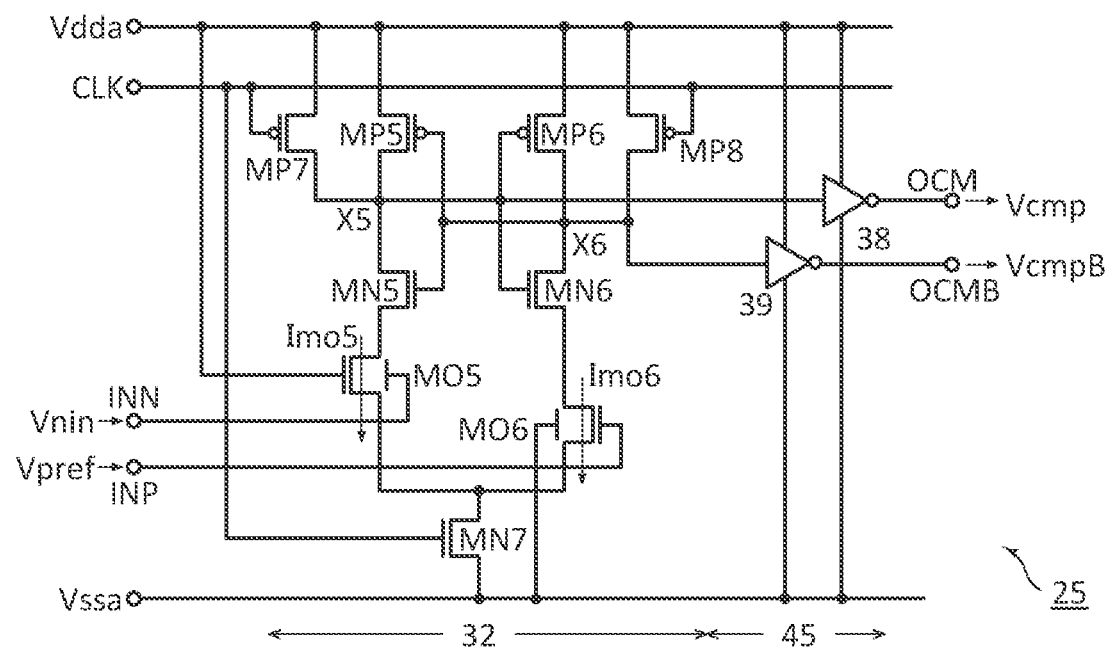
FIG. 5 is a circuit diagram illustrating a configuration example of a comparison circuit.

The monitor circuit 155 includes the comparison circuit 25 (see FIG. 5). The clock signal GCK3 is input to the monitor circuit 155. The terminal INP is electrically connected to the terminal OB and the reference positive voltage Vpref is input to the terminal INN. The terminal OCMB is electrically connected to an input terminal of the driver circuit 154.

Here, the monitor circuit 155 monitors the lowering of the voltage Vob. When the voltage Vob is higher than the negative voltage VBG, the monitor circuit 155 outputs the signal MON at "L". When the voltage Vob is lower than the negative voltage VBG, the monitor circuit 155 outputs the signal MON at "H"

The negative voltage supply device 101 performs operation similarly to the negative voltage supply device 100 (see FIG. 10). Power consumption in a period during which the signal WAKE is at "H" (i.e., dynamic power consumption) in the negative voltage supply device 101 is smaller than that in the negative voltage supply device 100.

In a period during which the signal WAKE is at "H", current always flows in the monitor circuit 128 of the negative voltage supply device 100 regardless of the level of the clock signal GCK2. In contrast, the output OCMB of the monitor circuit 155 is fixed at "L" in a period during which the clock signal GCK3 is at "L". Thus, current consumption of the monitor circuit 155 can be smaller than current consumption of the monitor circuit 128.

The monitor circuit 155 is provided for each terminal OB, so that a negative voltage can be stable output from each terminal OB. However, as the number of terminals OB is increased, the influence of current consumption of the monitor circuit 155 increases. Thus, reduction in current consumption of the monitor circuit 155 is effective in reducing the entire dynamic power consumption of the negative voltage supply device 101.

In order to reduce dynamic power consumption, a clock signal is set at low speed. If the clock signal GCK1 is set at low speed, it takes time for the voltage Vcp to reach the negative voltage VBG. In other words, the time during which the signal WAKE is at "H" becomes longer. Thus, only the clock signal GCK3 is set at low speed, so that dynamic power consumption of the negative voltage supply device 101 can be effectively reduced.

<Another Configuration Example of Monitor Circuit>

Since the monitor circuit 155 is composed of a dynamic comparison circuit, the signal MON of the terminal OCM might become unstable when the same amount of current flows through two OS transistors of a differential pair. Next, measures to stabilize the signal MON are described with reference to FIGS. 13A and 13B.

Figure 13A:
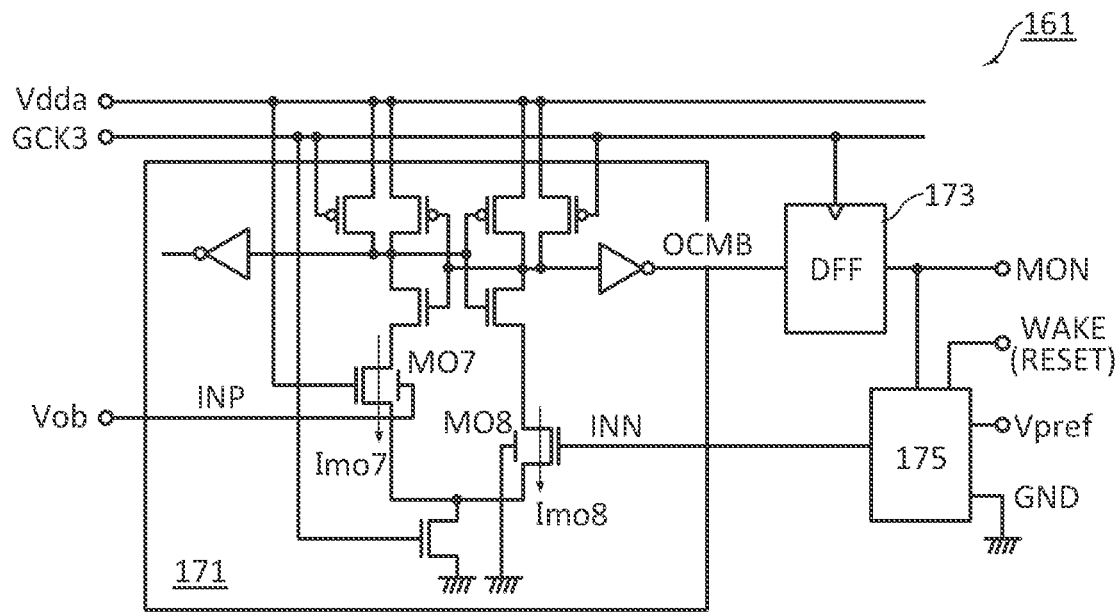
FIGS. 13A and 13B are circuit diagrams each illustrating a configuration example of a negative voltage holding circuit.
Figure 13B:
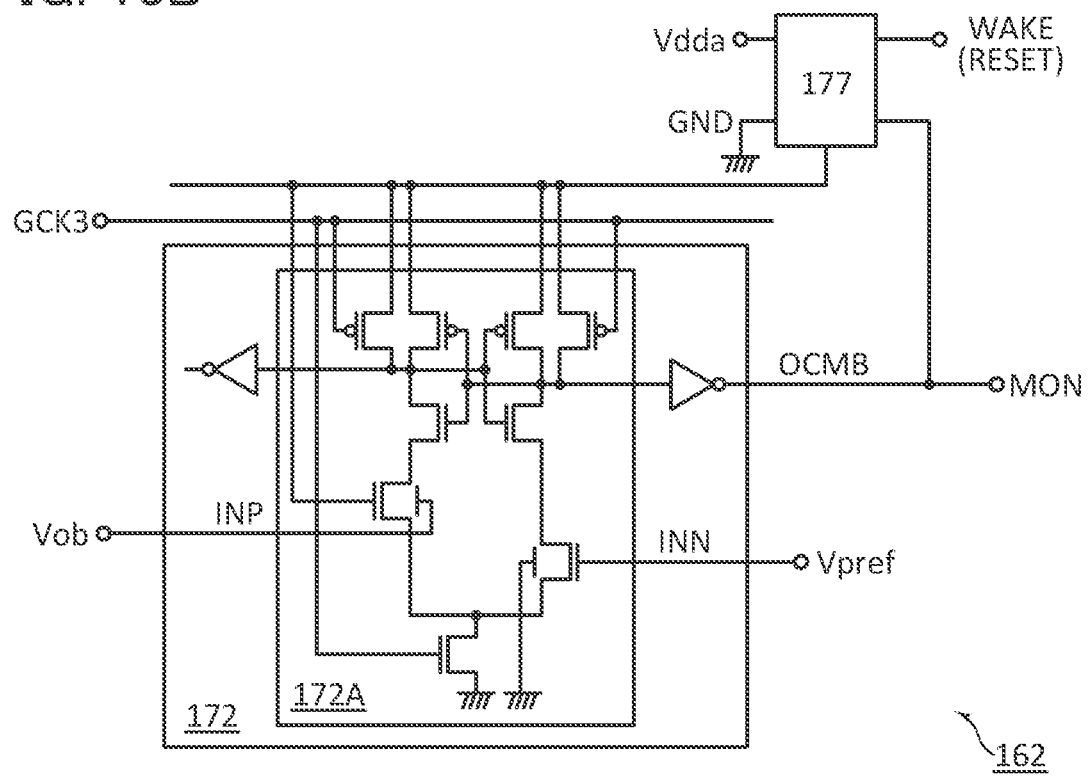

FIG. 13A illustrates an example in which the positive reference voltage for the dynamic comparison circuit is switched in response to the signal MON. FIG. 13B illustrates an example in which the power supply for the differential input circuit of the dynamic comparison circuit is controlled in response to the signal MON.

(Monitor Circuit 161)

A monitor circuit 161 illustrated in FIG. 13A includes a comparison circuit 171, a latch circuit 173, and a selection circuit 175.

The comparison circuit 171 is composed of the comparison circuit 25. A differential pair of the comparison circuit 171 is composed of transistors MO7 and MO8. Currents Imo7 and Imo8 are drain currents of the transistors MO7 and MO8, respectively.

Data of the latch circuit 173 is updated by the output of the comparison circuit 171 in synchronization with rising of the clock signal GCK3. An output signal of the latch circuit 173 is the signal MON. For example, the latch circuit 173 can include a delay flip-flop (DFF) circuit.

The selection circuit 175 selects a voltage input to the terminal INN of the comparison circuit 171 from among the positive reference voltage Vpref and the voltage GND. The signal MON and the signal WAKE are input to the selection circuit 175. The signal WAKE serves as a reset signal (RESET) for the selection circuit 175. Note that a signal other than the signal WAKE may be used as the reset signal.

The operation example of the monitor circuit 161 is described. When the signal WAKE at "L" goes into "H", the selection circuit 175 is reset to supply the positive reference voltage Vpref to the terminal INN. When the clock signal GCK3 is active, the comparison circuit 171 compares the voltage Vob of the terminal OB with the negative voltage VBG. When the voltage Vob is higher than the negative voltage VBG, the signal MON is at "L". When the signal MON is at "L", the selection circuit 175 inputs the positive reference voltage Vpref to the terminal INN.

When the voltage Vob becomes lower than the negative voltage VBG and the clock signal GCK3 is at "H", a signal at "H" is output from the terminal OCMB. At this time, the current Imo7 may become equivalent to the current Imo8, so that the output of the terminal OCMB might be oscillated. If the selection circuit 175 detects the rise of the signal MON at predetermined number of times (once or more), the voltage GND is supplied to the terminal INN. Then, the current Imo8 is lowered to cause a difference between the current Imo7 and the current Imo8, so that the output of the terminal OCMB is stabilized. The terminal OCMB can stably output a signal at "H" when the clock signal GCK3 is at "H".

In this example, the voltage GND is input to the terminal INN, but there is no limitation on signal as long as there is a difference between the currents Imo7 and Imo8 when the signal MON is at "H". A positive voltage smaller than the voltage Vpref may be input to the terminal INN. The use of the voltage GND does not increase the types of voltage to be used.

(Monitor Circuit 162)

A monitor circuit 162 illustrated in FIG. 13B includes a comparison circuit 172 and a selection circuit 177. The comparison circuit 172 is composed of the comparison circuit 25. The latch circuit 173 may be provided in the monitor circuit 162 as in the monitor circuit 161.

The selection circuit 177 controls the supply of a high-level-side power supply voltage to a differential input circuit 172A of the comparison circuit 172. The signals MON and WAKE are input to the selection circuit 177. The signal WAKE serves as a reset signal of the selection circuit 177. A signal other than the signal WAKE may be used as the reset signal.

When the signal WAKE at "L" goes into "H", the selection circuit 177 is reset to supply the voltage Vdda to the differential input circuit 172A. When the clock signal GCK3 is active, the comparison circuit 172 compares the voltage Vob of the terminal OB with the negative voltage VBG. If the selection circuit 177 detects the rise of the signal MON at predetermined number of times (once or more), the voltage GND is supplied to the differential input circuit 172A. As a result, two inverter circuits in the differential input circuit 172A are inactivated, and thus the output of the comparison circuit 172 is not oscillated.

The negative voltage supply device in this embodiment is suitable for a negative voltage power supply circuit in a variety of semiconductor devices. As a semiconductor device in which the negative voltage supply device is used as a power supply circuit, there are a variety of semiconductor devices in which a substrate bias voltage is a negative voltage (e.g., a DRAM and an image sensor), a semiconductor device driven by a negative voltage (e.g., a memory device such as a flash memory), and a semiconductor device including an OS transistor having a backgate, for example. In Embodiment 3, a structure example of a semiconductor device including the negative voltage supply device is described.

Embodiment 3

<<Memory Device>>

Here, a memory device whose data retention portion includes an OS transistor is described as a semiconductor device using an OS transistor.

Figure 14A:
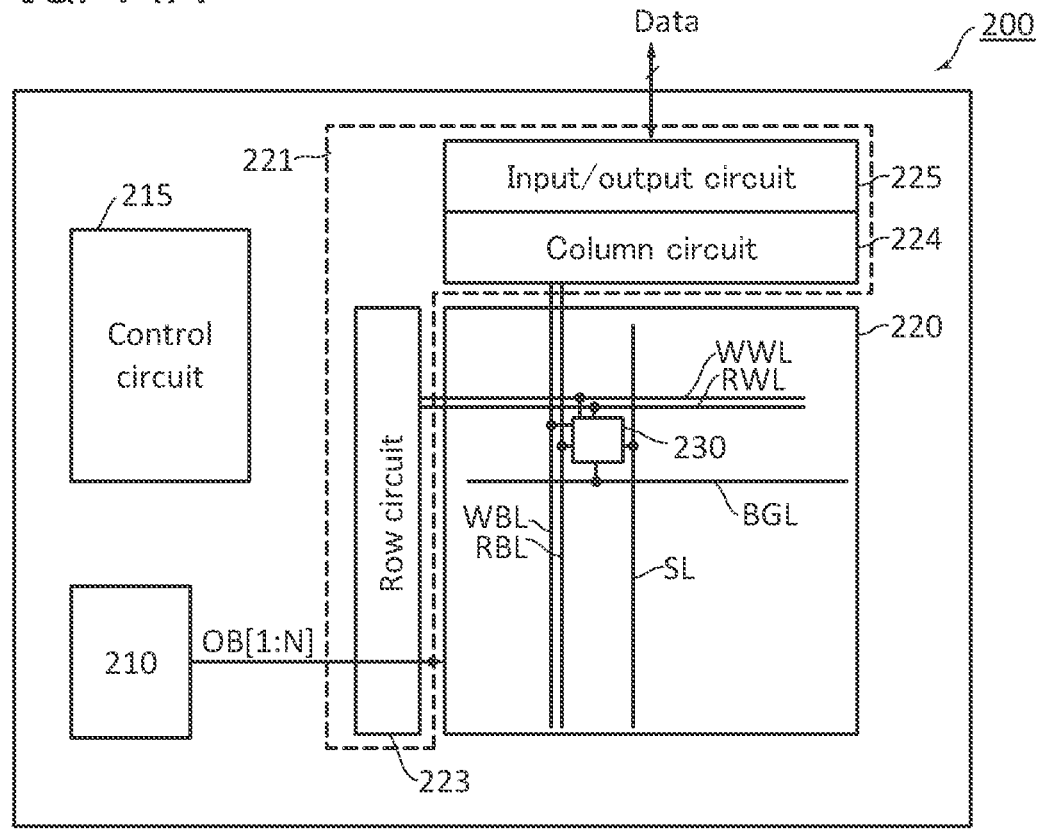
FIG. 14A is a block diagram illustrating a configuration example of a memory device and FIG. 14B is a circuit diagram illustrating a configuration example of a memory cell.

A memory device 200 illustrated in FIG. 14A includes a negative voltage supply device 210, a control circuit 215, a memory cell array 220, and a peripheral circuit 221. The peripheral circuit 221 includes a row circuit 223, a column circuit 224, and an input/output circuit 225.

The memory cell array 220 includes a memory cell 230, a readout word line RWL, a write word line WWL, a readout bit line RBL, a write bit line WBL, a source line SL, and a wiring BGL. Note that the readout word line RWL and the write word line WWL may be referred to as a word line RWL and a word line WWL, respectively. The readout bit line RBL and the write bit line WBL may be referred to as a bit line RBL and a bit line WBL.

The control circuit 215 controls the memory device 200 as a whole and performs writing of data WDA and reading of data RDA. The controller circuit 215 processes command signals (e.g., a chip enable signal and a write enable signal) from the outside and generates control signals for the peripheral circuits 221.

The negative voltage supply device described in Embodiment 2 is used as the negative voltage supply device 210. The negative voltage supply device 210 includes N terminals OB[1] to OB[N] (N is an integer of 2 or more). The terminals OB[1] to OB[N] each output a negative voltage Vbg1. The memory cell array 220 is divided into N blocks. The wiring BGL of each block is electrically connected to the terminal OB.

The row circuit 223 has a function of selecting a row to be accessed. For example, the row circuit 223 includes a row decoder and a word line driver. The column circuit 224 has a function of precharging the bit lines WBL and RBL, a function of writing data to the bit line WBL, a function of amplifying data of the bit line RBL, a function of reading data from the bit line RBL, and the like. The input/output circuit 225 has a function of holding writing data, a function of holding readout data, and the like.

The configuration of the peripheral circuits 221 is appropriately changed depending on the configuration, readout method, writing method, and the like of the memory cell array 220.

<Memory Cell 230>

Figure 14B:
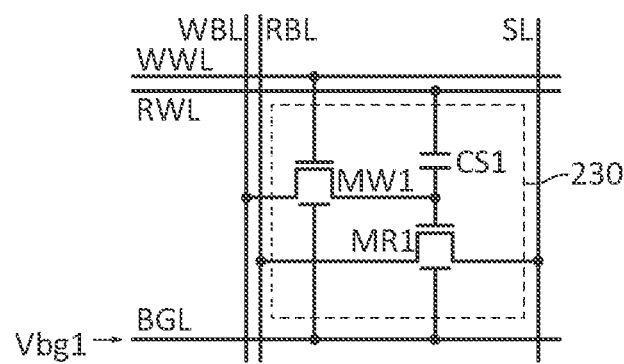

FIG. 14B illustrates the circuit configuration example of the memory cell 230. The memory cell 230 in this example is a 2-transistor (2T) gain cell. The memory cell 230 includes transistors MW1 and MR1 and a capacitor CS1. The transistors MW1 and MR1 are a write transistor and a readout transistor, respectively. The backgates of the transistors MW1 and MR1 are electrically connected to the wiring BGL.

Since the readout transistor is an OS transistor, the memory cell 230 does not consume power for data retention. Thus, the memory cell 230 is a low-power-consuming memory cell that can hold data for a long time. The memory device 200 can be used as a non-volatile memory device. The OS transistor and the capacitor can be stacked over a Si transistor. Accordingly, the memory cell array 220 can be stacked over the peripheral circuit 221, resulting in higher integration degree of the memory cell array 220.

Other configuration examples of a memory cell are described with reference to FIGS. 15A to 15F.

<Memory Cells 231 to 235>

Figure 15A:
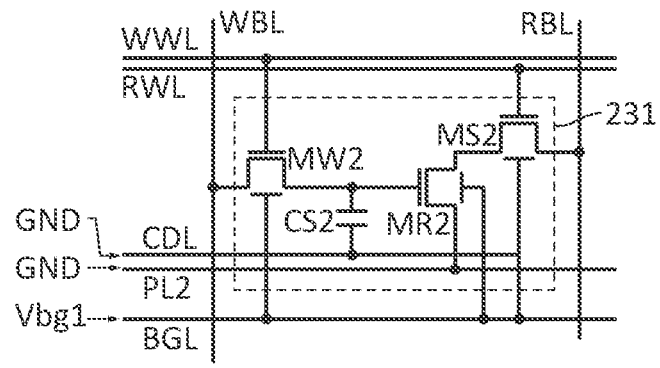
FIGS. 15A to 15F are circuit diagrams each illustrating a configuration example of a memory cell.

A memory cell 231 illustrated in FIG. 15A is a 3T gain cell including transistors MW2, MR2, and MS2 and a capacitor CS2. The transistors MW2, MR2, and MS2 are a write transistor, a readout transistor, and a selection transistor, respectively. Backgates of the transistors MW2, MR2, and MS2 are electrically connected to the wiring BGL. The memory cell 231 is electrically connected to the word lines RWL and WWL, the bit lines RBL and WBL, a capacitor line CDL, and a power supply line PL2. For example, a voltage GND (a low-level-side power supply voltage) is input to the capacitor line CDL and the power supply line PL2.

Figure 15B:
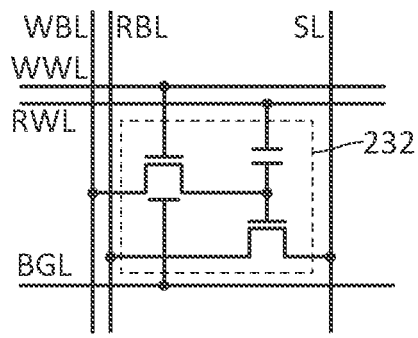
Figure 15C:
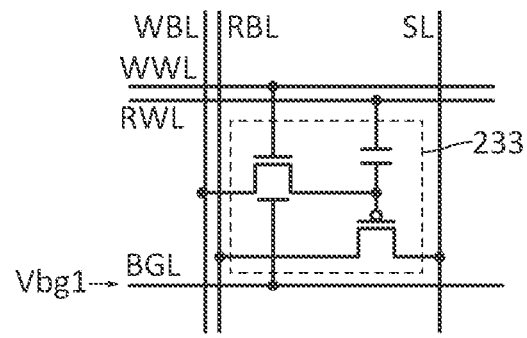

FIGS. 15B and 15C illustrate other configuration examples of a 2T gain cell. In a memory cell 232 illustrated in FIG. 15B, an n-channel Si transistor is used as a readout transistor. In a memory cell 233 illustrated in FIG. 15C, a p-channel Si transistor is used as a readout transistor.

Figure 15D:
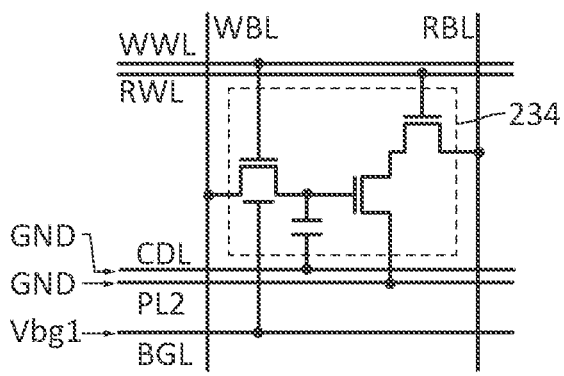
Figure 15E:
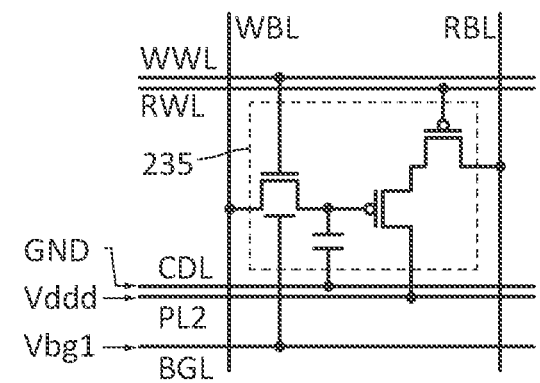

FIGS. 15D and 15E illustrate other configuration examples of a 3T gain cell. In a memory cell 234 illustrated in FIG. 15D, n-channel Si transistors are used as a readout transistor and a selection transistor. In a memory cell 235 illustrated in FIG. 15E, p-channel Si transistors are used as a readout transistor and a selection transistor. In the example of FIG. 15E, the voltage Vddd (a high-level-side power supply voltage) is input to the power supply line PL2.

In these gain cells, a bit line serving as both of the readout bit line RBL and the write bit line WBL may be provided.

<Memory Cell 236>

Figure 15F:
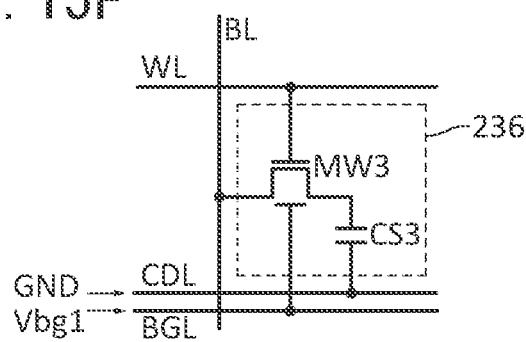

FIG. 15F illustrates an example of a 1T1C (Capacitor) memory cell. A memory cell 236 illustrated in FIG. 15F is electrically connected to a word line WL, a bit line BL, the capacitor line CDL, and the wiring BGL. The memory cell 236 includes a transistor MW3 and a capacitor CS3. A backgate of the transistor MW3 is electrically connected to the wiring BGL.

<Memory Cell 237>

Figure 16A:
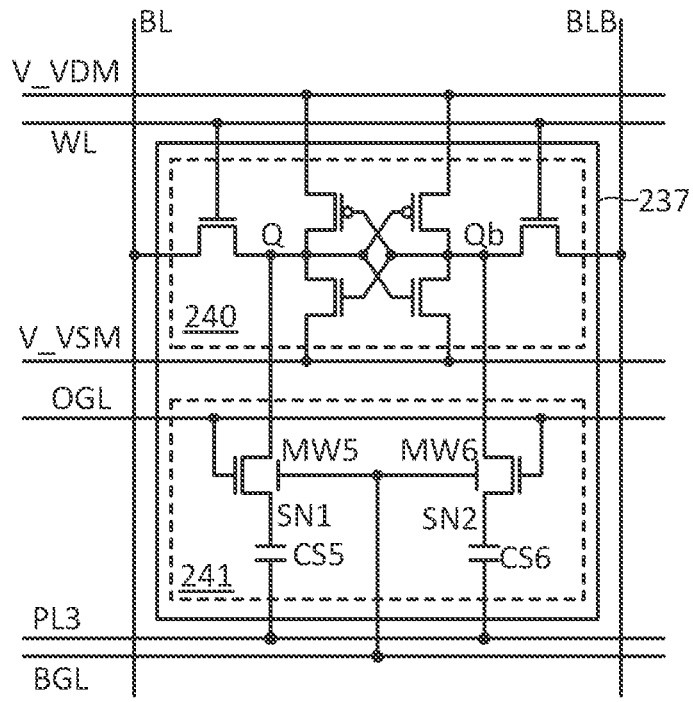
FIG. 16A is a circuit diagram illustrating a configuration example of a memory cell and FIG. 16B is a timing chart showing an operation example of the memory cell.

A memory cell 237 illustrated in FIG. 16A includes a memory cell 240 and a backup circuit 241. The memory cell 240 has the same circuit configuration as an ordinary 6T SRAM cell.

The backup circuit 241 is a circuit for having a backup of data of nodes Q and Qb included in the memory cell 240 and is composed of two 1T1C cells. Nodes SN1 and SN2 are retention nodes. A gain cell composed of a transistor MW5 and a capacitor CS5 backs up data of the node Q. A gain cell composed of a transistor MW6 and the capacitor CS6 backs up data of a node Qb.

Since the transistors MW5 and MW6 are OS transistors, the memory cell 240 can be stacked over the backup circuit 241. Accordingly, the area overhead of the memory cell 237 due to addition of the backup circuit 241 can be reduced. The area overhead can be zero.

The memory cell 240 is electrically connected to power supply lines V_VDM and V_VSM, the word line WL, and a bit-line pair (BL and BLB). The power supply lines V_VDM and V_VSM are power supply lines for Vddd and GND, respectively. The backup circuit 241 is electrically connected to wirings OGL and BGL and a power supply line PL3. The voltage GND is input to the power supply line PL3.

Figure 16B:
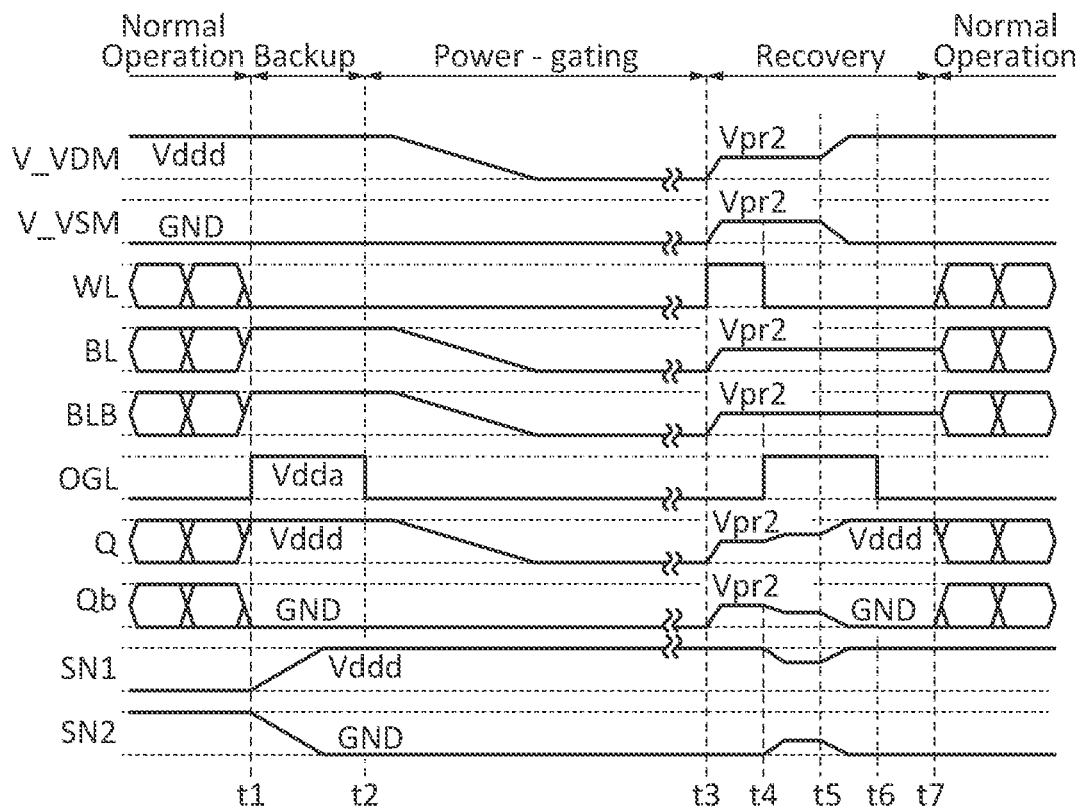

The memory cell 237 in a normal state operates as an SRAM cell. The operation example of the memory cell 237 is described with reference to FIG. 16B. If the memory cell 237 is not accessed for a predetermined time or longer, the supply of the voltages Vddd and GND to the power supply lines V_VDM and V_VSM are stopped. Before the supply of the voltage Vddd is stopped, data of the nodes Q and Qb are written to the backup circuit 241. Time is denoted by t1, t2, and the like in FIG. 16B.

(Normal Operation)

Before time t1, the memory cell 237 is in a normal operation state (a write state or a readout state). The memory cell 237 operates in a manner similar to a single-port SRAM. At time t1, the nodes Q, Qb, SN1, and SN2 are at "H", "L", "L", and "H", respectively.

(Backup)

The wiring OGL goes into "H" at t1, whereby backup operation starts and the transistors MW5 and MW6 are turned on. The voltage of the node SN1 increases from GND to Vddd. The voltage of the node SN2 decreases from Vddd to GND. The wiring OGL goes into "L" at t2, whereby the backup operation terminates. Data of the node Q and data of the node Qb at t1 are written to the node SN1 and the node SN2, respectively.

(Power-Gating)

Power-gating starts at t2. The voltage of the power supply line V_VDM is changed from Vddd to GND. A voltage difference between the power supply lines V_VDM and V_VSM is reduced, whereby the memory cell 240 becomes inactive. Although data in the memory cell 240 is lost, the backup circuit 241 continuously holds data. During the power-gating, the bit lines BL and BLB are in a floating state.

(Recovery)

Recovery operation is operation of recovering data of the memory cell 240 with the use of data held in the backup circuit 241. In the recovery operation, the memory cell 240 functions as a sense amplifier for sensing data in the nodes Q and Qb.

First, the reset operation of the nodes Q and Qb is performed. At t3, the voltage of the bit-line pair (BL and BLB) is precharged to a voltage Vpr2. In addition, the word line WL is selected. Thus, the power supply lines V_VDM and V_VSM are precharged to the voltage Vpr2, and the voltages of the nodes Q and Qb are fixed to Vpr2.

The wiring OGL goes into "H" at t4, whereby the transistors MW5 and MW6 are turned on. The charge in the capacitor CS5 is distributed to the node Q and the node SN1. The charge in the capacitor CS6 is distributed to the node Qb and the node SN2. Consequently, a voltage difference is generated between the node Q and the node Qb.

The supply of the voltages VDM and GND resumes at t5. The memory cell 240 is activated to amplify a voltage difference between the nodes Q and Qb. Finally, the voltages of the nodes Q and SN1 become Vddd, and the voltages of the nodes Qb and SN2 become GND. In other words, the states of the nodes Q and Qb are returned to the states at t1, i.e., "H" and "L," respectively.

<Memory Cell 238>

Figure 17A:
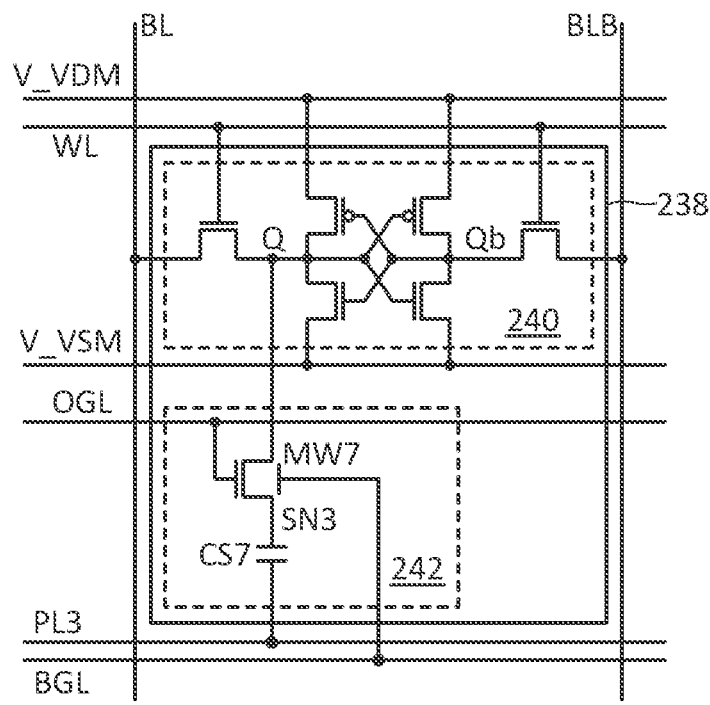
FIG. 17A is a circuit diagram illustrating a configuration example of a memory cell and FIG. 17B is a timing chart showing an operation example of the memory cell.

A memory cell 238 illustrated in FIG. 17A is a modification example of the memory cell 237 and includes a backup circuit 242 instead of the backup circuit 241. The backup circuit 242 is composed of one 1T1C memory cell and includes a node SN3, a transistor MW7, and a capacitor CS7.

Figure 17B:
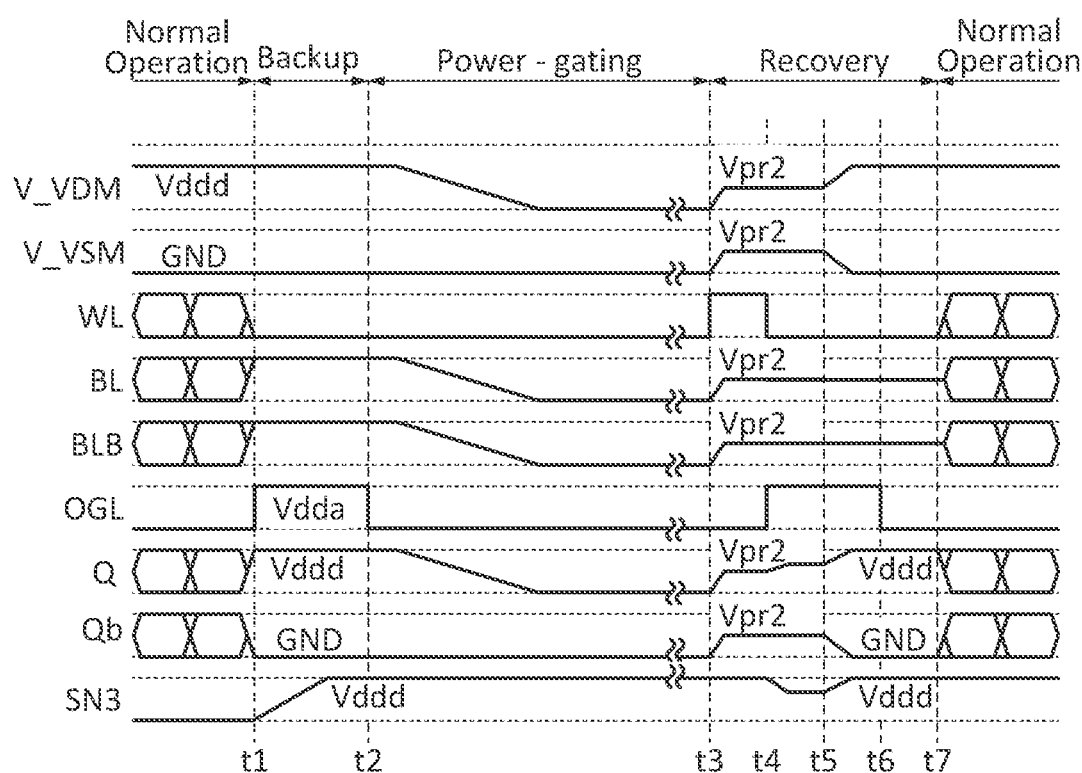

FIG. 17B is a timing chart showing an operation example of the memory cell 238. The memory cell 238 operates in a manner similar to the memory cell 237. The description of FIG. 16B can be referred to for the description of FIG. 17B.

The backup circuit 242 backs up only data of the node Q, but can restore data in the nodes Q and Qb with data held in the node SN3. This is because the nodes Q and Qb are precharged to Vpr2 in advance, and thus, a potential difference can be generated between the node Q and the node Qb with the use of a charge in one capacitor CS7.

In this specification and the like, a memory device whose data retention portion such as a memory cell includes an OS transistor is referred to as an OS-memory device in some cases. Examples of the OS-memory device include a DOSRAM (registered trademark), an NOSRAM (registered trademark), an OS-SRAM, and the like.

DOSRAM is an abbreviation for Dynamic Oxide Semiconductor RAM and denotes an RAM including a 1T1C memory cell (see FIG. 15F). NOSRAM is an abbreviation for Nonvolatile Oxide Semiconductor RAM and denotes an RAM including a gain cell (see FIG. 14A and FIGS. 15A to 15D). OS-SRAM denotes a RAM including an SRAM cell (see FIG. 16A and FIG. 17A) including a backup circuit.

Next, a processing device is described as an example of a semiconductor device. Here, a microcontroller unit (MCU) and an FPGA are shown as the examples.

<<MCU>>

Figure 18:
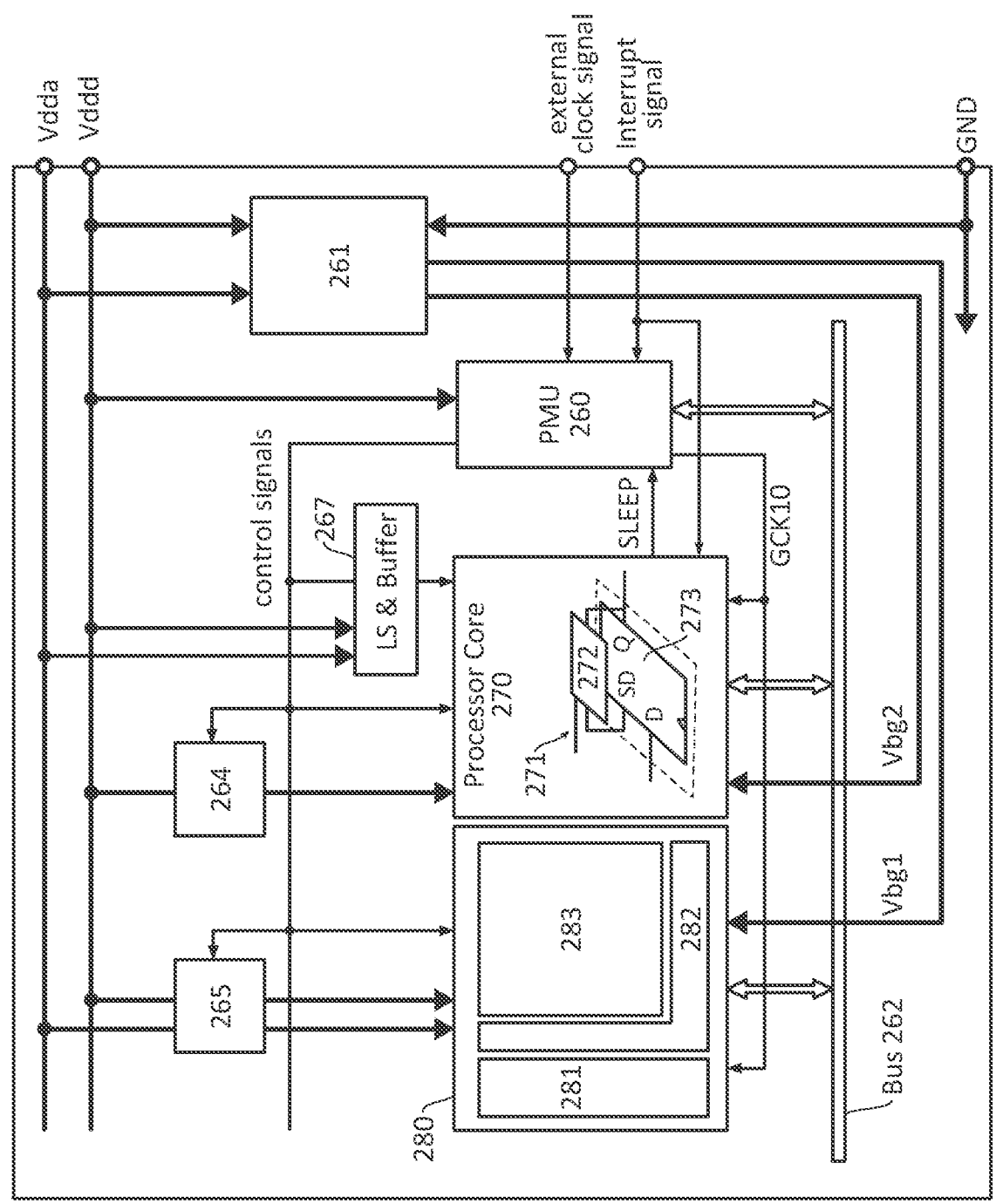
FIG. 18 is a block diagram illustrating a structure example of a microcontroller unit.

A MCU 250 in FIG. 18 is a semiconductor device that is capable of clock gating and power-gating.

The voltages Vddd, Vdda, and GND are input to the MCU 250. The MCU 250 includes a power management unit (PMU) 260, a negative voltage supply device 261, a bus 262, power switches 264 and 265, a level shifter (LS) and buffer circuit 267, a processor core 270 (hereinafter referred to as core 270), and a memory device 280. The exchange of data and the like between the PMU 260, the core 270, and the memory device 280 is performed through the bus 262.

In order to reduce the power consumption of a semiconductor device, circuits that do not need to be operated are stopped by power-gating or clock gating. A flip-flop is a kind of sequential circuit (storage circuit that holds its state) included in a semiconductor device in many cases. Thus, a reduction in power consumption of the flip-flop is effective in reducing the power consumption of a semiconductor device including the flip-flop. In general, the state of the flip-flop is erased (data held therein is lost) when power supply is stopped. It is thus necessary to make backup of the state of the flip-flop so that the semiconductor device is power gated.

The core 270 includes a plurality of flip-flops 271. The flip-flop 271 is provided for a variety of registers in the core 270. The flip-flop 271 includes a backup circuit 272 and a scan flip-flop 273. In other words, the flip-flop 271 is a scan flip-flop including a backup circuit.

Figure 19:
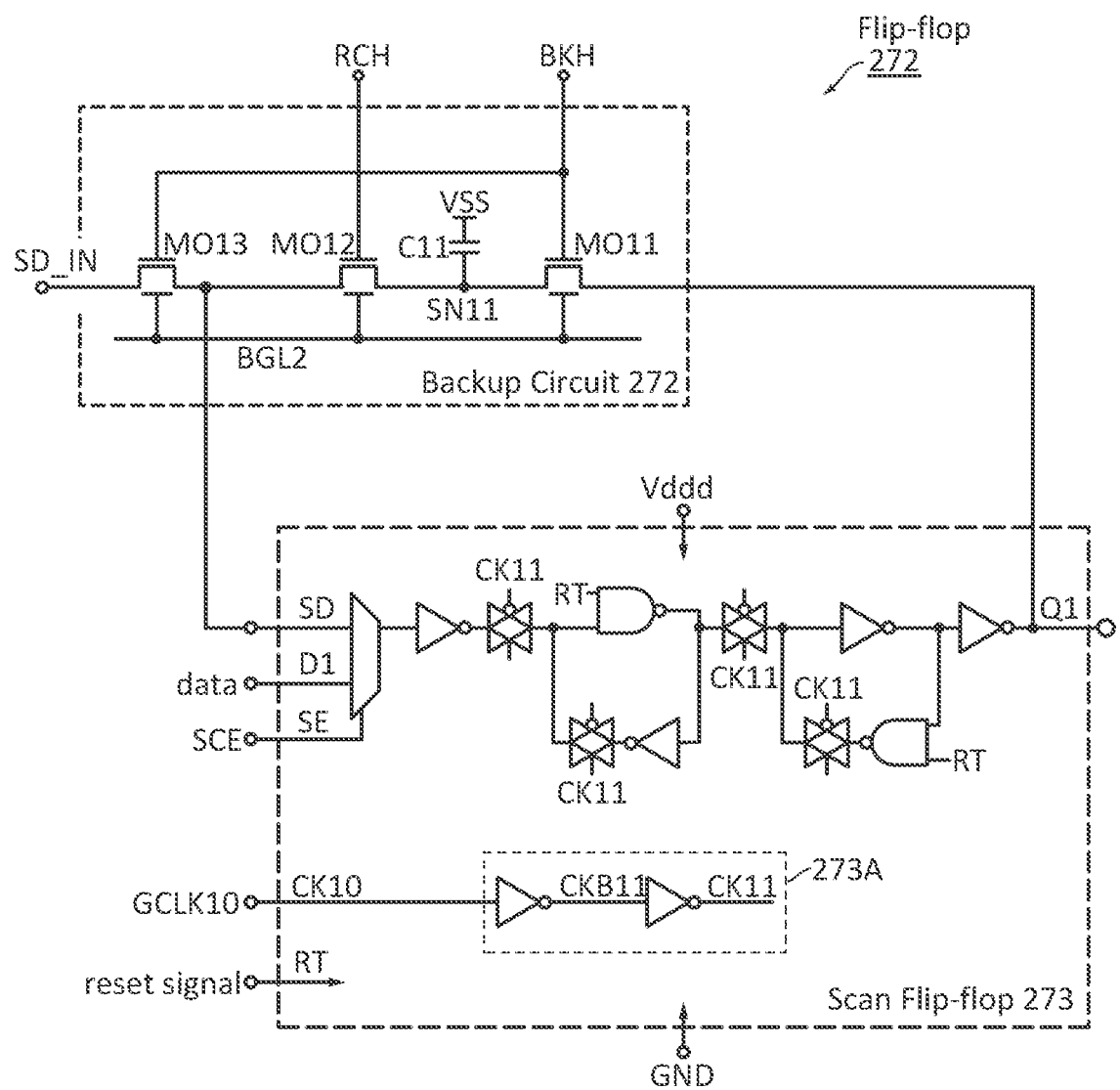
FIG. 19 is a circuit diagram illustrating a structure example of a flip-flop.

The backup circuit 272 is provided for the flip-flop 271 to store data of the flip-flop 271 in clock gating and power-gating. The backup circuit 272 includes a plurality of OS transistors having backgates. The backup circuit 272 can be stacked over a logic cell composed of a Si transistor because no Si transistor is included in the backup circuit 272. FIG. 19 illustrates a circuit configuration example of the flip-flop 271.

The scan flip-flop 273 includes nodes D1, Q1, SD, SE, RT, and CK10 and a clock buffer circuit 273A.

The node D1 is a data input node, the node Q1 is a data output node, and the node SD is a scan test data input node. The node SE is a signal SCE input node. The node CK10 is a clock signal GCLK10 input node. The clock signal GCLK10 is input to the clock buffer circuit 272A. Respective analog switches in the scan flip-flop 273 are electrically connected to nodes CK11 and CKB11 of the clock buffer circuit 273A. The node RT is a reset signal input node.

When the signal SCE is at "L", data of the node D1 is input to the scan flip-flop 273. When the signal SCE is at "H", data of the node SD is input to the scan flip-flop 273.

The circuit configuration of the scan flip-flop 273 is not limited to that in FIG. 19. Any scan flip-flop prepared in a standard circuit library can be used.

The backup circuit 272 includes nodes SD_IN and SN11, transistors MO11 to MO13, a capacitor C11, and a node SN11. The on/off of the transistor MO11 and the on/off of the transistor MO13 are controlled by the signal BKH, and the on/off of the transistor MO12 is controlled by the signal RCH. The backgates of the transistors MO11 to MO13 are electrically connected to a wiring BGL2 in the CPU core 330. The negative voltage Vbg2 is input to a wiring BGL1.

The node SD_IN is a scan test data input node and is electrically connected to the node Q1 of another scan flip-flop 273. The node SN11 is a retention node of the backup circuit 340.

Because of the feature of the OS transistor, i.e., an extremely low off-state current, a decrease in the voltage of the node SN11 can be prevented and almost no power is consumed to hold data; therefore, the backup circuit 272 is capable of holding data for a long time, i.e., nonvolatile. Hence, while the CPU core 330 is in a power-gating state, data can be held in the backup circuit 340.

The memory device 280 includes a control circuit 281, a periphery circuit 282, and a memory cell array 283. The OS-memory device can be employed for the memory device 280.

The negative voltage supply device in Embodiment 2 is used as the negative voltage supply device 261. The negative voltage supply device 261 generates the negative voltages Vbg1 and Vbg2 from the voltage GND. The negative voltage supply device 261 includes a plurality of terminals OB1 for outputting Vbg1 and a plurality of terminals OB2 for outputting Vbg2. The negative voltages Vbg1 and Vbg2 are input to the memory device 280 and the core 270, respectively.

A clock signal, an interrupt request signal, and the like are inputted to the MCU 250 from the outside. The external clock signal is inputted to the PMU 260. The interrupt request signal is inputted to the PMU 260 and the core 270.

The PMU 260 has a function of controlling clock gating and power-gating. The PMU 260 generates a gated clock signal GCK10 (hereinafter referred to as GCLK10) from an external clock signal. The clock signal GCLK10 is input to the core 270 and the memory device 280. The PMU 260 generates a variety of control signals. The control signals include control signals for the power switches 264 and 265, a control signal for the backup circuit 272, and a control signal for the scan flip-flop 273 (e.g., a reset signal).

The control signal for the backup circuit 272 is inputted to the LS and buffer circuit 267. The LS and buffer circuit 267 has a function of level-shift the control signal and of holding the level-shifted control signal. The control signal held by the LS and buffer circuit 267 is inputted to the backup circuit 272.

The power switch 264 controls the supply of the voltage Vddd to the core 270. The power switch 265 controls the supply of the voltages Vddd and Vdda to the memory device 280. When the core 270 includes a plurality of power supply domains, power switches corresponding to the power supply domains are provided as the power switch 264. The same applies to the power switch 265. In addition to the voltages Vddd and Vdda, a plurality of positive voltages in accordance with the circuit configuration are input to the memory device 280. The positive voltages input to the memory device 280 are a voltage for precharging a bit line, a reference voltage for reading out data, and the like.

A signal SLEEP is output from the core 270 to the PMU 260. The signal SLEEP is a trigger signal for putting the core 270 in the sleep mode (standby mode). When the signal SLEEP is input to the PMU 260, the PMU 260 outputs a control signal for transition from the active mode to the sleep mode to a functional circuit to be controlled. The transition from the active mode to the sleep mode can also be performed by the input of an interrupt request signal.

First, the PMU 260 stops supplying the clock signal to the core 270 to transfer it from the active mode to the sleep mode. Then, data in the scan flip-flop 273 is written to the backup circuit 272. Specifically, the signal BKH at "H" is input to the backup circuit 272 for a predetermined clock cycle.

Processing for returning the core 270 from the sleep mode to the active mode is executed by the input of an interrupt request signal, for example. In response to the interrupt request signal, the PMU 260 outputs a control signal for transition from the sleep mode to the active mode to a functional circuit which is to be controlled. The PMU 260 controls the power switches 264 and 265 to restart the potential supply to the core 270 and the memory device 280. Then, the data held in the backup circuit 272 is recovered to the scan flip-flop 273. Specifically, the signal BCH at "H" is input to the backup circuit 272 for a predetermined clock cycle, and a signal SCE at "H" is input to the scan flip-flop 273. Finally, the supply of the clock signal GCLK10 to the core 270 and the memory device 280 is restarted.

The PMU 260 performs clock gating and power-gating of the memory device 280 like the core 270.

A timer circuit for counting time may be provided in the PMU 260 for power-gating of the core 270 and the memory device 280 on the basis of the counted time.

<<FPGA>>

Figure 20:
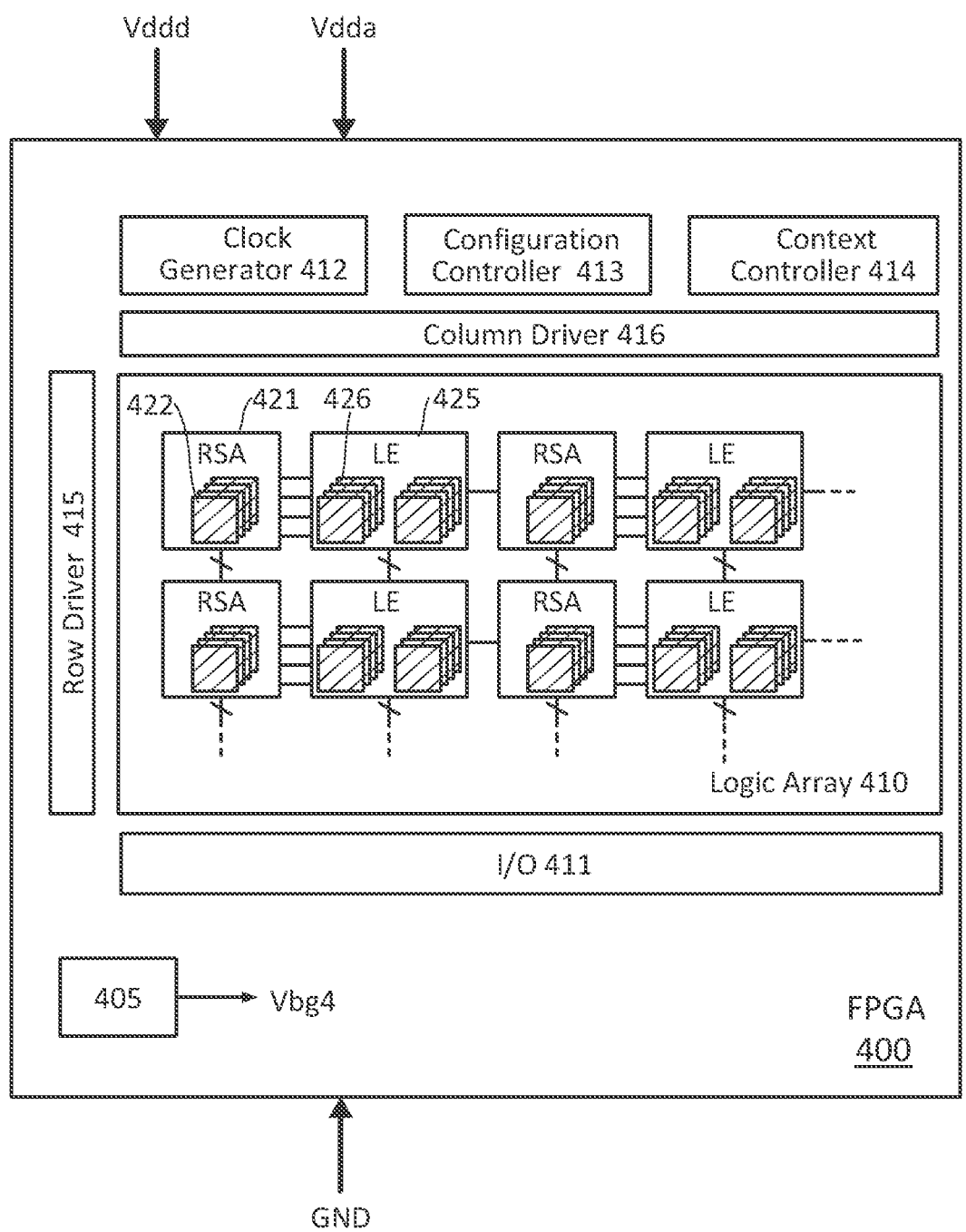
FIG. 20 is a block diagram illustrating a configuration example of an FPGA.

FIG. 20 illustrates an example of an FPGA. An FPGA 400 illustrated in FIG. 20 includes a negative voltage supply device 405, a logic array 410, an input/output unit (I/O) 411, and peripheral circuits. One or more of the OS-memory devices may be incorporated in the FPGA 400.

The I/O 411 is an input/output interface of the logic array 410. The peripheral circuits include functional circuits for driving the logic array 410 and the I/O 411. For example, the peripheral circuits include a clock generator 412, a configuration controller 413, a context controller 414, a row driver 415, and a column driver 416. The Vddd, Vdda, and GND are input to the FPGA 400.

The negative voltage supply device in Embodiment 2 is used as the negative voltage supply device 405. The negative voltage supply device 405 generates a negative voltage Vbg4 from the voltage GND and includes a plurality of terminals OB for the negative voltage Vbg4. The FPGA 400 includes an OS transistor in a configuration data retention portion. The negative voltage Vbg4 is input to a backgate of the OS transistor.

The logic array 410 includes a routing switch array (RSA) 421 and a logic element (LE) 425. Here, the LE 425 is a logic circuit having four inputs and one output. The RSA 421 includes a plurality of routing switches (RSs) 422. The RS 422 controls connection between two LEs 422. A plurality of the LEs 425 arranged in the same column may be connected to one another so as to configure a register chain.

The LE 425 includes a plurality of configuration memories (CFMs) 426. The circuit configuration of the LE 425 determined by configuration data stored in the CFMs 426. The CFM 426 is a configuration memory corresponding to a multi-context and capable of storing sets of configuration data. Moreover, each RS 422 includes a memory device corresponding to a multi-context, and connection between the LEs 425 is determined by configuration data stored in the RSs 422.

The configuration of the FPGA 400 can be changed quickly by switching the sets of configuration data to be loaded. The sets of configuration data can be switched by the context controller 414. The row driver 415 and the column driver 416 are circuits for driving the RSs 422 and CFMs 426. The configuration controller 413 has a function of controlling the row driver 415 and the column driver 416.

Here, a configuration example of the logic array 410 with two contexts is described. The two contexts are referred to as "CNTXT0" and "CNTXT1". A context signal for selecting CNTXT0 is referred to as "ctx[0]", and a context signal for selecting CNTXT1 is referred to as "ctx[1]".

<Wiring Switch (RS)>

Figure 21A:
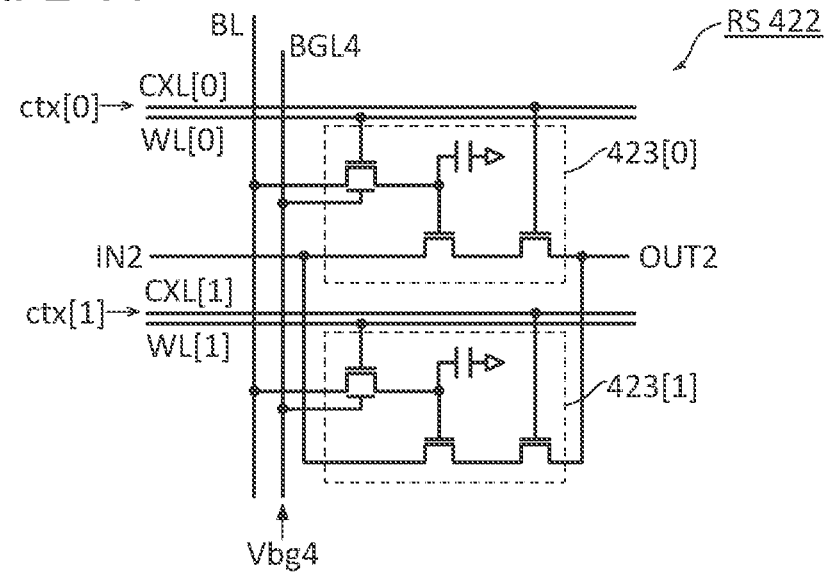
FIG. 21A is a circuit diagram illustrating a configuration example of a routing switch and FIG. 21B is a circuit diagram illustrating a configuration example of a configuration memory.

The RSA 421 includes a plurality of RSs 422. FIG. 21A illustrates a configuration example of the RS 422. The RS 422 is a programmable routing switch, in which a terminal IN2 is electrically connected to an output terminal of one LE 425 and a terminal OUT2 is electrically connected to an input node of another LE 425. In the RS 422, two switch circuits 423 (hereinafter referred to as SWs 423) are electrically connected parallel to each other between the terminal IN2 and the terminal OUT2. Note that in the case where the number of contexts is larger than 2, as many SWs 423 as contexts may be electrically connected parallel to each other between the terminal IN2 and the terminal OUT2.

The SW 423 has the same circuit configuration as a 3T gain cell. A backgate of an OS transistor of the SW 423 is electrically connected to the wiring BGL2. The negative voltage Vbg4 is input to the wiring BGL2.

A SW 423[0] and a SW 423[1] are connected to a common bit line BL. The column driver 416 writes configuration data to the bit line BL. A SW 423 [i] (i is 0 or 1) is electrically connected to a word line WL[i] and a wiring CXL[i]. The wiring CXL[i] is a wiring for a context signal. When CNTXT0 is selected, the selection transistor of the SW 423 [0] is turned on by ctx[0] and the selection transistor of the SW 423[1] is turned off by ctx[1]. In contrast, when CNTXT1 is selected, the selection transistor of the SW 423[0] is turned off and the selection transistor of the SW 423[1] is turned on.

<Configuration Memory (CFM)>

Figure 21B:
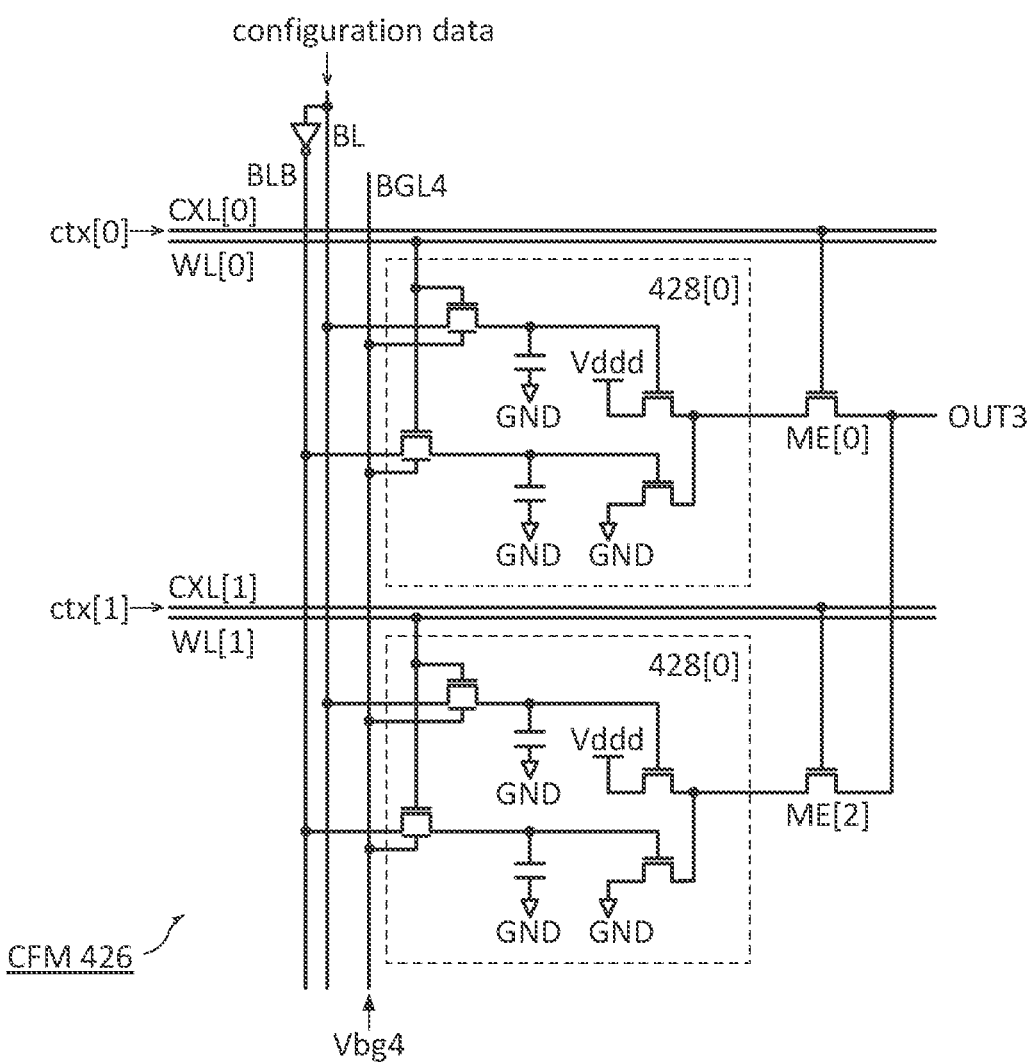

FIG. 21B illustrates a configuration example of a CFM 426. The CFM 426 includes two memory cells 428 and two transistors ME.

Memory cells 428[0] and 428[1] are electrically connected to a common bit-line pair (BL and BLB). Configuration data and the inverted data thereof are written to the bit line BL and the bit line BLB, respectively. The memory cell 428[i] is electrically connected to the word line WL[i] and the wiring CXL[i]. The transistor ME[i] controls the conduction between a terminal OUT3 and an output terminal of the memory cell 428[i].

The memory cell 428[i] is composed of two gain cells. One of the gain cells stores data of the bit line BL, and the other stores data of the bit line BLB. A backgate of an OS transistor of the memory cell 428[i] is electrically connected to the wiring BGL4.

In the case where CNTXT0 is selected, the transistor ME[0] is turned on by ctx[0] and configuration data stored in the memory cell 428[0] is output from the terminal OUT3. In the case where CNTXT1 is selected, the transistor ME[1] is turned on by ctx[1] and configuration data stored in the memory cell 428[1] is output.

<<Imaging Device>>

Figure 22A:
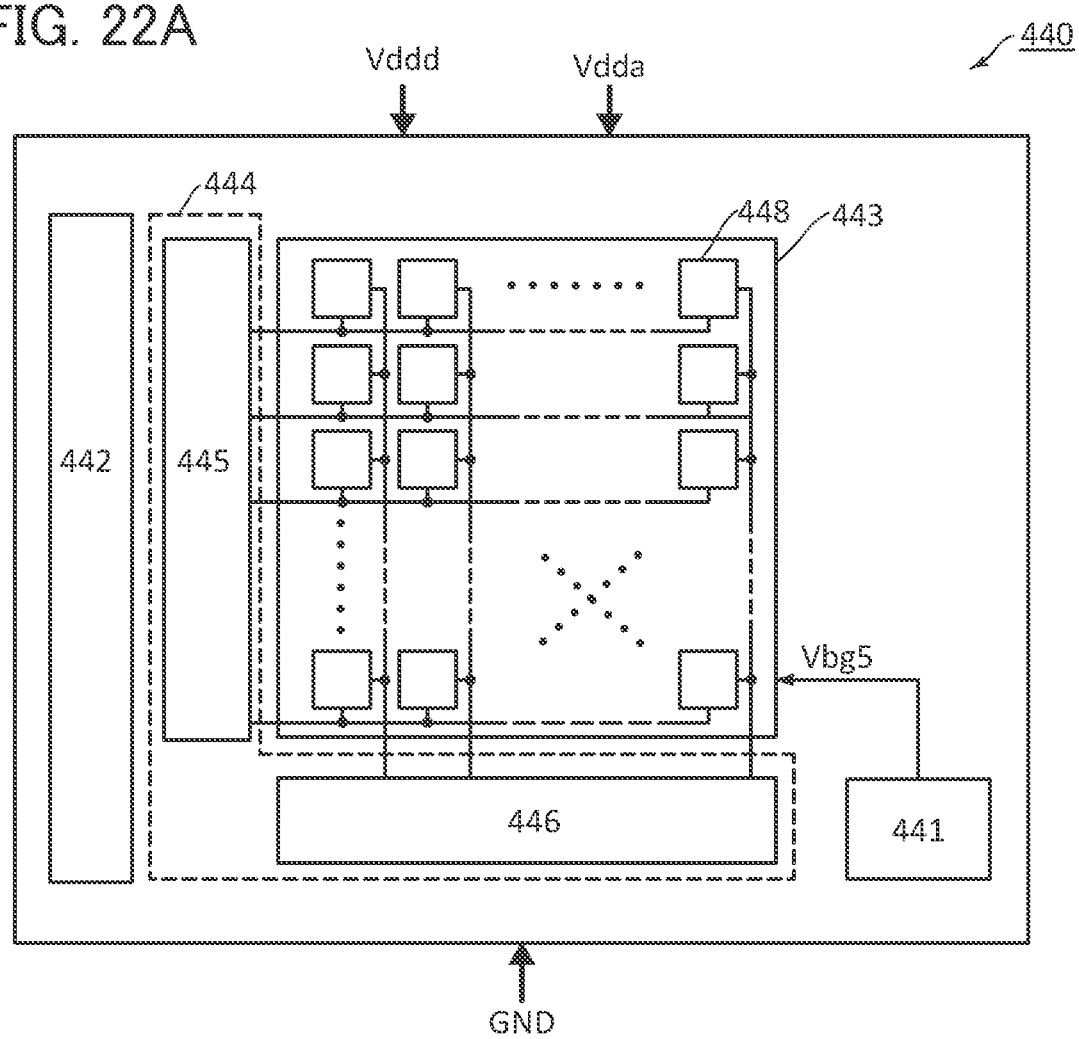
FIG. 22A is a block diagram illustrating a configuration example of an imaging device and FIG. 22B is a circuit diagram illustrating a configuration example of a pixel.

In this embodiment, an imaging device will be described as an example of a semiconductor device. An imaging device 440 illustrated in FIG. 22A includes a negative voltage supply device 441, a control circuit 442, a pixel array 443, and a peripheral circuit 444. The peripheral circuit 444 includes a row driver 445 and a column driver 446. The pixel array 443 includes a plurality of pixels 448 arranged in a matrix of rows and columns. The pixel 448 is an imaging device having a function of converting light into electric charge, a function of accumulating electric charge, and the like.

The voltages Vddd, Vdda, and GND are input to the imaging device 440. The negative voltage supply device in Embodiment 2 is used as the negative voltage supply device 441. The negative voltage supply device 441 generates a negative voltage Vbg5 from the voltage GND and includes a plurality of terminals OB for the negative voltage Vbg5.

Figure 22B:
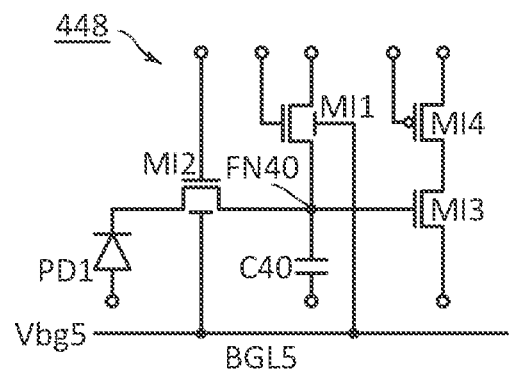

FIG. 22B shows an example of the pixel 448. The pixel 448 includes a photodiode PD1, transistors MI1 to MI4, a capacitor C40, and a node FN40. The node FN40 serves as a data-holding node. The capacitor C40 is a storage capacitor for holding the voltage of the node FN40. The transistor MI1 is referred to as a reset transistor. The transistor MI1 has a function of resetting the voltage of the node FN40. The transistor MI2 is referred to as an exposure transistor that controls exposure operation. The transistor MI2 is a pass transistor that controls a conduction state between the node FN40 and the photodiode PD1. With the transistor MI2, the exposure operation timing can be controlled; thus, an image can be taken by a global shutter method. The transistor MI3 is referred to as an amplifier transistor. The transistor MI3 has a function of generating on-state current corresponding to the voltage of the node FN40. The transistor MI4 is referred to as a selection transistor. The transistor MI4 is a pass transistor that controls a conduction state between the transistor MI3 and an output terminal of the pixel 448.

Backgates of the transistors MI1 and MI2 are electrically connected to a wiring BGL5. The negative voltage Vbg5 is input to the wiring BGL5, whereby the cutoff current of the transistors MI1 and MI2 can be reduced. Thus, variation in voltage of the node FN40 can be further reduced, and high-resolution imaging can be performed.

A p-n junction or p-i junction diode element in a silicon substrate, a p-i-n diode element using an amorphous silicon film (amorphous silicon film or a microcrystalline silicon film), or the like can be used as the photodiode PD1. Note that another photoelectric conversion element may be used instead of the photodiode in the pixel 448. For example, a diode-connected transistor may be used. Further alternatively, a variable resistor or the like utilizing a photoelectric effect may be formed using silicon, germanium, selenium, or the like. A photoelectric conversion element that includes selenium utilizing a phenomenon called avalanche multiplication may be used. In the photoelectric conversion element, a highly sensitive sensor in which the amount of amplification of electrons with respect to the amount of incident light is large can be obtained. As a selenium-based material, amorphous selenium or crystalline selenium can be used. Crystalline selenium may be obtained by, for example, depositing amorphous selenium and then performing heat treatment. When the crystal grain size of crystalline selenium is smaller than a pixel pitch, variation in characteristics between the pixels 448 can be reduced.

<<Electronic Component>>

Next, an electronic component including the above-described semiconductor device is described with reference to FIGS. 23A and 23B.

Figure 23A:
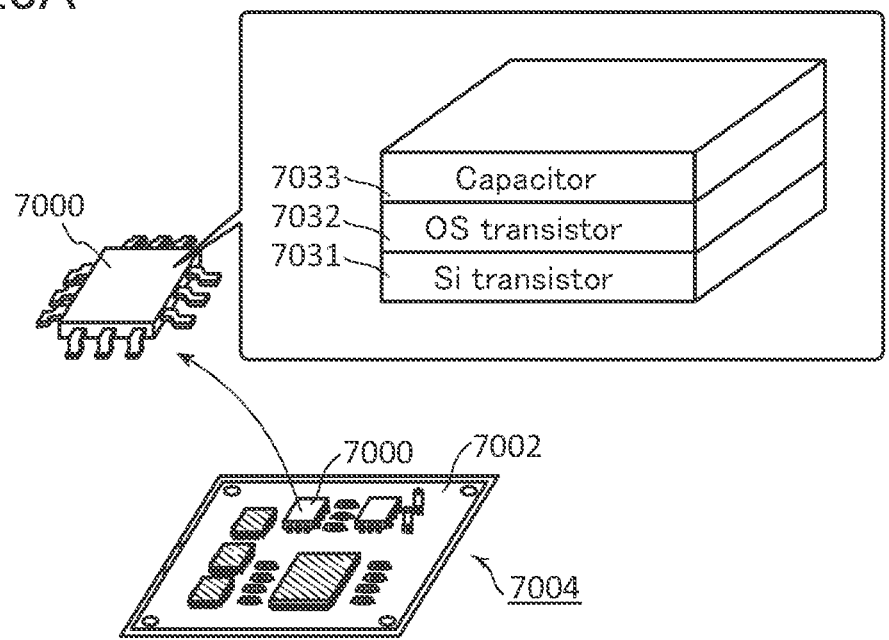
FIGS. 23A and 23B are schematic perspective views of electronic components.

An electronic component 7000 illustrated in FIG. 23A is a package IC chip including a lead and a circuit portion. Although a Quad Flat Package (QFP) is used as the package of the electronic component 7000 in FIG. 23A, the embodiment of the package is not limited thereto.

The electronic component 7000 is mounted on a printed circuit board 7002, for example. A plurality of such IC chips are combined and electrically connected to each other on the printed circuit board 7002; thus, a circuit board on which electronic components are mounted (a circuit board 7004) is formed.

The circuit portion of the electronic component 7000 has a stacked-layer structure. At least three kinds of layers 7031 to 7033 are included in the circuit portion. The layer 7031 includes an Si transistor formed with an Si wafer. The layers 7032 and 7033 include an OS transistor and a capacitor, respectively. The layer 7033 may be provided between the layers 7031 and 7032.

Figure 23B:
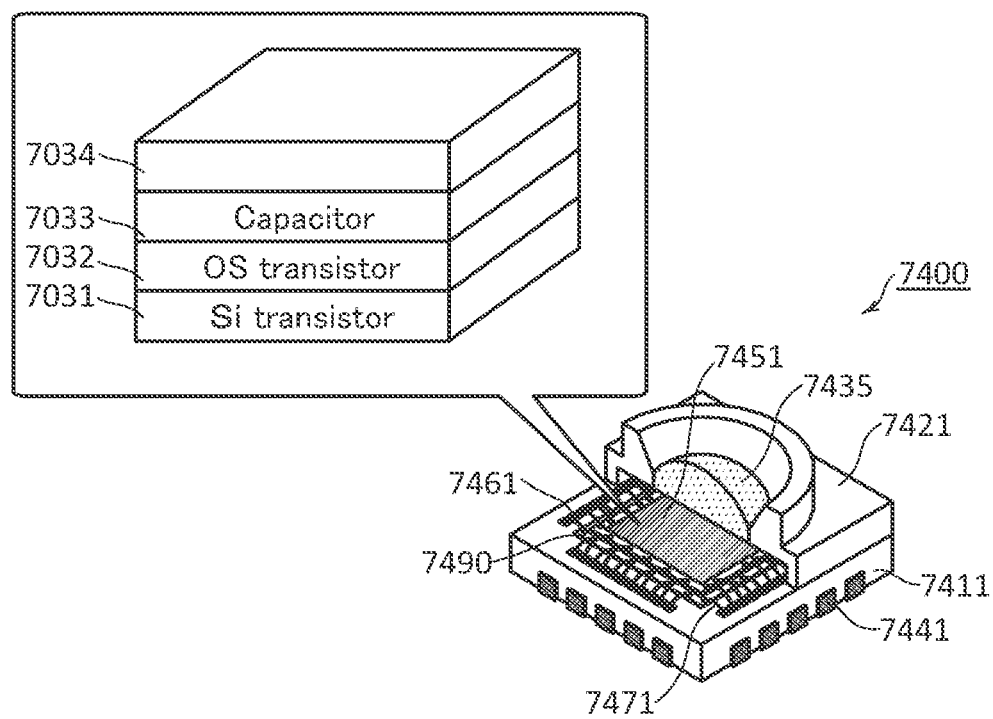

FIG. 23B is a schematic view of an electronic component 7400. The electronic component 7400 is a camera module including an image sensor chip 7451. The image sensor chip 7451 includes the imaging device 440 (see FIG. 22A). At least the layers 7031 to 7033 and a layer 7034 are included in the image sensor chip 7451. The layer 7034 includes a photoelectric conversion element.

The electronic component 7400 includes a package substrate 7411 to which the image sensor chip 7451 is fixed, a lens cover 7421, a lens 7435, and the like. Part of the lens cover 7421 and lens 7435 are not illustrated in FIG. 23B in order to illustrate an inner structure of the electronic component 7400.

A signal processing circuit and the like are provided between the package substrate 7411 and the image sensor chip 7451. The electronic component 7400 is a system in package (SiP).

A land 7441 is electrically connected to an electrode pad 7461. The electrode pad 7461 is electrically connected to the image sensor chip 7451 or an IC chip 7490 through a wiring 7471. The IC chip 7490 may include the OS-memory device described above.

<<Electronic Device>>

Embodiments of an electronic device including the above electronic component are described with reference to FIGS. 24A and 24D.

Figure 24A:
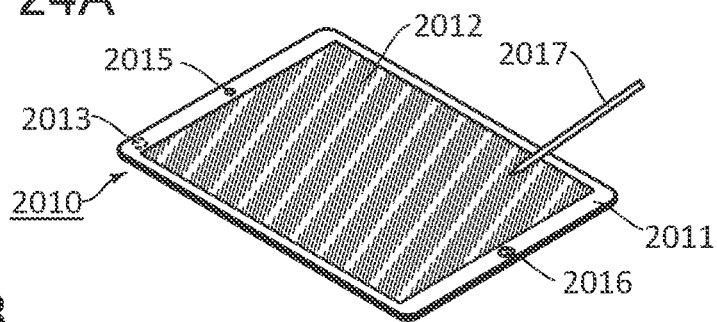
FIGS. 24A to 24D are diagrams each illustrating a structure example of an electronic device.

FIG. 24A illustrates a structure example of a tablet information terminal. An information terminal 2010 illustrated in FIG. 24A includes a housing 2011, a display portion 2012, an illuminance sensor 2013, a camera 2015, an operation button 2016, and the like. A memory device, a processing device, and the like which are formed of the electronic component 7000 are incorporated into the housing 2011. The electronic component 7000 may be used for a controller or the like in the display portion 2012. The electronic component 7440 is used for the camera 2015.

The display portion 2012 includes the display system in which a touch sensor is incorporated. The information terminal 2010 can be operated when a stylus pen 2017 (or an electronic pen), a finger, or the like touches a screen of the information terminal 2010. The information terminal 2010 has functions of a voice call, a video call with the use of the camera 2015, e-mailing, an appointment organizer, Internet communication, music reproduction, and the like.

Figure 24B:
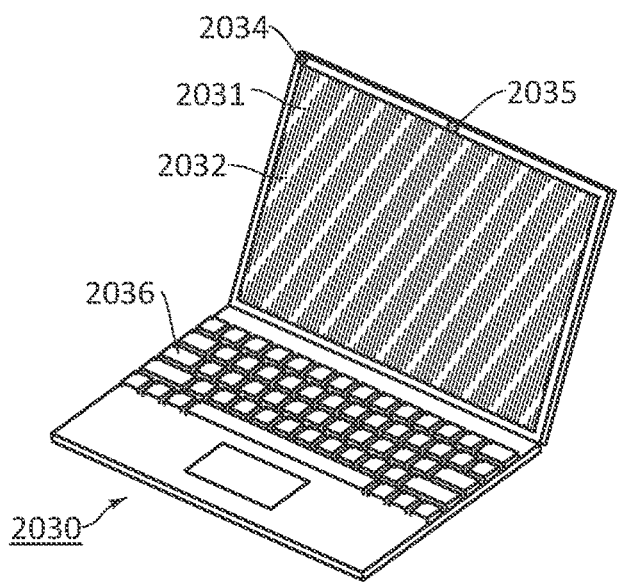

FIG. 24B illustrates a structure example of a personal computer (PC). A PC 2030 in FIG. 24B includes a housing 2031, a display portion 2032, an optical sensor 2034, a camera 2035, and a keyboard 2036. The keyboard 2036 may be attached to or detached from the housing 3031. When the keyboard 2036 is attached to the housing 2033, the PC 2030 can be used as a laptop PC. When the keyboard 2036 is detached from the housing 2031, the PC 3030 can be used as a tablet PC.

A memory device, a processing device, a controller of the display portion 2032, and the like are incorporated into the housing 3011. The electronic component 7000 is used for them. The electronic component 2440 is used for the camera 2035.

Figure 24C:
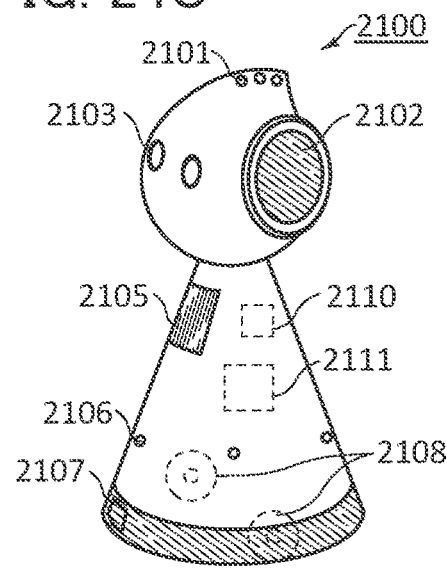

A robot 2100 illustrated in FIG. 24C includes an illuminance sensor 2101, a microphone 2102, an upper camera 2103, a speaker 2104, a display portion 2105, a lower camera 2106, an obstacle sensor 2107, a moving mechanism 2108, a processing device 2110, and a memory device 2111.

The electronic component 7000 can be used for the processing device 2110, the memory device 2111, a controller of the display portion 2105, and the like. The electronic component 7440 is used for the upper camera 2103 and the lower camera 2106.

A variety of information is displayed on the display portion 2105. The robot 2100 can display information the user wants to see in the display portion 2105. A touch panel may be incorporated in the display portion 2105.

Voice communication between the user and the robot 2100 is achieved using the microphone 2102 and the speaker 2104.

Images of the surroundings of the robot 2100 are taken by the upper camera 2103 and the lower camera 2106. For example, on the basis of the information on the user taken by the upper camera 2103, voice of the robot 2100 from the speaker 2104 is selected.

The robot 2100 can move with the moving mechanism 2108. The obstacle sensor 2107 can sense the presence or absence of an obstacle in the moving direction of the robot 2100. The robot 2100 can recognize the surrounding environment using the upper camera 2103, the lower camera 2106, and the obstacle sensor 2107 and can move safely and independently.

Figure 24D:
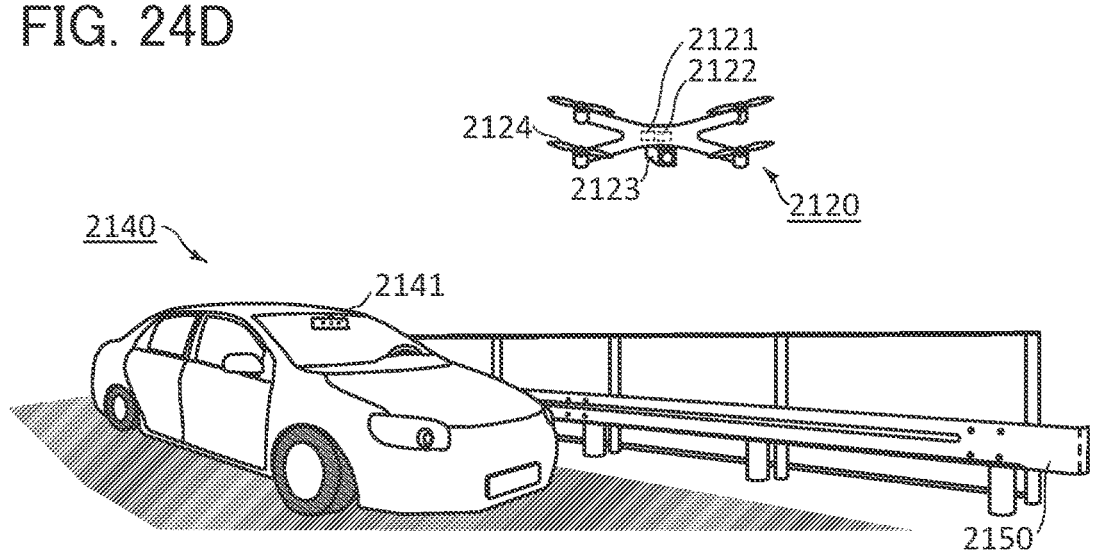

A flying object 2120 illustrated in FIG. 24D includes a processing device 2121, a memory device 2122, a camera 2123, and a propeller 2124. The electronic component 7000 is used in the processing device 2121, the memory device 2122, and the like. The electronic component 7400 is included in the camera 2123.

An automobile 2140 illustrated in FIG. 24D includes various sensors, such as infrared radar, millimeter wave radar, and laser radar. The automobile 2140 judges traffic information therearound such as the presence of a guard rail 2150 or a pedestrian with analyzing an image taken by the camera 2141, and can perform automatic driving. The electronic component 7400 is incorporated in the camera 2141. In addition, the electronic component 7000 is incorporated in an electronic circuit (e.g., a processing device and a memory device) of the automobile 2140.

<<Circuit Portion of Electronic Component>>

Figure 25:
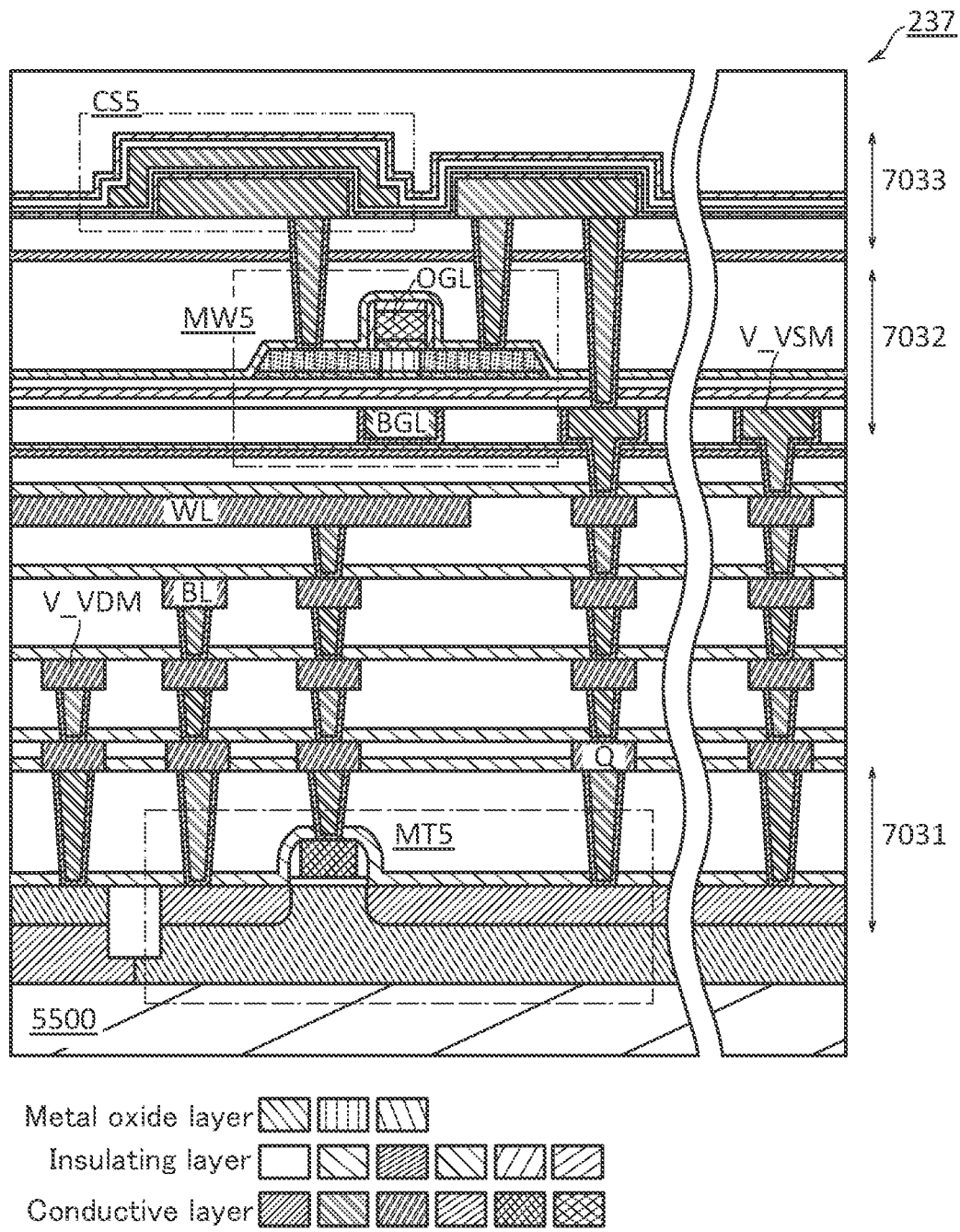
FIG. 25 is a cross-sectional view illustrating a stacked-layer structure example of a circuit portion of an electronic component.

A stacked-layer structure of a circuit portion of the electronic component 7000 is described with reference to FIG. 25. FIG. 25 illustrates a cross-sectional structure of the memory cell 237 (see FIG. 16A) as an example. FIG. 25 illustrates the transistor MW5, the capacitor CS5, and the transistor MT5. The transistor MT5 is a transfer transistor electrically connected to the bit line BL and is formed with a single crystal silicon wafer 5500. Note that FIG. 25 is not a cross-sectional view of an IC chip taken along a specific line but a cross-sectional view for illustrating an example of the stacked-layer structure of the IC chip.

The transistor MT5, the transistor MW5, and the capacitor CS5 are formed in the layer 7031, the layer 7032, and the layer 7033, respectively. A plurality of wiring layers is provided between the layers 7031 and 7032. The word line WL and the like are provided in the wiring layers. The transistor MW5 has a structure similar to that of an OS transistor 5003 (see FIG. 26B) to be described later.

<<OS Transistor Structure Example>>

Next, structure examples of the OS transistor are described with reference to FIGS. 26A and 26B. Cross-sectional structures of the OS transistors in the channel length direction are illustrated on the left side of FIGS. 26A and 26B. Cross-sectional structures of the OS transistors in the channel width direction are illustrated on the right side of FIGS. 26A and 26B.

Figure 26A:
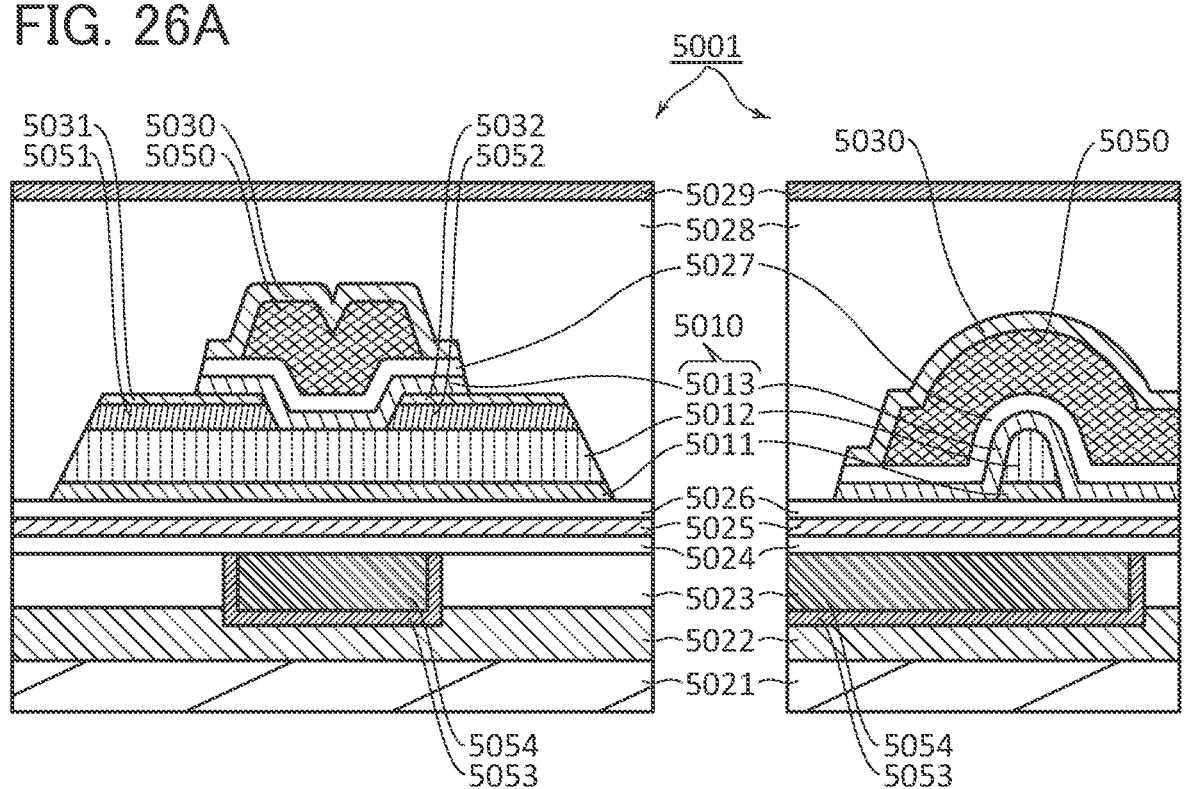
FIGS. 26A and 26B are cross-sectional views each illustrating a structure example of an OS transistor.

The OS transistor 5001 illustrated in FIG. 26A is formed over an insulating surface, here, over an insulating layer

5001. Here, the OS transistor 5001 is formed over an insulating layer 5021. The OS transistor 5001 is covered with insulating layers 5028 and 5029. The OS transistor 5001 includes insulating layers 5022 to 5027 and 5030 to 5032, metal oxide layers 5011 to 5013, and conductive layers 5050 to 5054.

Note that the insulating layers, the metal oxide layers, the conductors, and the like in the drawing may each have a single-layer structure or a stacked-layer structure. These layers can be formed by any of a variety of deposition methods such as a sputtering method, a molecular beam epitaxy (MBE) method, a pulsed laser ablation (PLA) method, a CVD method, and an atomic layer deposition (ALD) method. Examples of the CVD method include a plasma CVD method, a thermal CVD method, and a metal organic CVD method.

The metal oxide layers 5011 to 5013 are collectively referred to as an oxide layer 5010. As illustrated in FIG. 26A, the oxide layer 5010 includes a portion where the metal oxide layer 5011, the metal oxide layer 5012, and the metal oxide layer 5013 are stacked in that order. When the OS transistor 5001 is on, a channel is mainly formed in the metal oxide layer 5012 of the oxide layer 5010.

A gate electrode of the OS transistor 5001 is formed using the conductive layer 5050. A pair of electrodes that function as a source electrode and a drain electrode of the OS transistor 5001 is formed using the conductive layers 5051 and 5052. The conductive layers 5050 to 5052 are covered with the insulating layers 5030 to 5032 functioning as barrier layers, respectively. A backgate electrode of the OS transistor 5001 is formed using a stack of the conductive layers 5053 and 5054.

A gate insulating layer on a gate side is formed using the insulating layer 5027. A gate insulating layer on a backgate side is formed using a stack of the insulating layers 5024 to 5026. The insulating layer 5028 is an interlayer insulating layer. The insulating layer 5029 is a barrier layer.

The metal oxide layer 5013 covers a stack of the metal oxide layers 5011 and 5012 and the conductive layers 5051 and 5052. The insulating layer 5027 covers the metal oxide layer 5013. The conductive layers 5051 and 5052 each include a region that overlaps with the conductive layer 5050 with the metal oxide layer 5013 and the insulating layer 5027 positioned therebetween.

Examples of a conductive material used for the conductive layers 5050 to 5054 include a semiconductor typified by polycrystalline silicon doped with an impurity element such as phosphorus; silicide such as nickel silicide; a metal such as molybdenum, titanium, tantalum, tungsten, aluminum, copper, chromium, neodymium, or scandium; and a metal nitride containing any of the above metals as its component (tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

For example, the conductive layer 5050 is a single layer of tantalum nitride or tungsten. Alternatively, in the case where the conductive layer 5050 has a two-layer structure or a three-layer structure, the following combinations can be used: aluminum and titanium; titanium nitride and titanium; titanium nitride and tungsten; tantalum nitride and tungsten; tungsten nitride and tungsten; titanium, aluminum, and titanium; titanium nitride, aluminum, and titanium; and titanium nitride, aluminum, and titanium nitride. The conductor written first is used for a layer on the insulating layer 5027 side.

The conductive layers 5051 and 5052 have the same layer structure. For example, in the case where the conductive layer 5051 is a single layer, any of metals such as aluminum, titanium, chromium, nickel, copper, yttrium, zirconium, molybdenum, silver, tantalum, and tungsten, or an alloy containing any of these metals as its main component may be used. In the case where the conductive layer 5051 has a two-layer structure or a three-layer structure, the following combinations can be used: titanium and aluminum; tungsten and aluminum; tungsten and copper; a copper-magnesium-aluminum alloy and copper; titanium and copper; titanium or titanium nitride, aluminum or copper, and titanium or titanium nitride; and molybdenum or molybdenum nitride, aluminum or copper, and molybdenum or molybdenum nitride. The conductor written first is used for a layer on the insulating layer 5027 side.

For example, it is preferable that the conductive layer 5053 be a conductive layer that has a hydrogen barrier property (e.g., a tantalum nitride layer) and that the conductive layer 5054 be a conductive layer that has higher conductivity than the conductive layer 5053 (e.g., a tungsten layer). With such a structure, the stack of the conductive layers 5053 and 5054 functions as a wiring and has a function of suppressing diffusion of hydrogen into the oxide layer 5010.

Examples of an insulating material used for the insulating layers 5021 to 5032 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 5021 to 5032 are each formed using a single-layer structure or a stacked-layer structure of these insulating materials. The layers used for the insulating layers 5021 to 5032 may include a plurality of insulating materials.

Note that in this specification and the like, an oxynitride refers to a compound that contains more oxygen than nitrogen, and a nitride oxide refers to a compound that contains more nitrogen than oxygen.

In the OS transistor 5001, the oxide layer 5010 is preferably surrounded by an insulating layer with oxygen and hydrogen barrier properties (hereinafter such an insulating layer is referred to as a barrier layer). With such a structure, it is possible to suppress the release of oxygen from the oxide layer 5010 and entry of hydrogen into the oxide layer 5010; thus, the reliability and electrical characteristics of the OS transistor 5001 can be improved.

For example, the insulating layer 5029 may function as a barrier layer and at least one of the insulating layers 5021, 5022, and 5024 may function as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride. Another barrier layer may be provided between the oxide layer 5010 and the conductive layer 5050. Alternatively, a metal oxide layer that has oxygen and hydrogen barrier properties may be provided as the metal oxide layer 5013.

The insulating layer 5030 is preferably a barrier layer that prevents the conductive layer 5050 from becoming oxidized. When the insulating layer 5030 has an oxygen barrier property, oxidation of the conductive layer 5050 due to oxygen released from the insulating layer 5028 or the like can be suppressed. For example, the insulating layer 5030 can be formed using a metal oxide such as aluminum oxide.

FIG. 26A illustrates an example in which the oxide layer 5010 has a three-layer structure; however, one embodiment of the present invention is not limited thereto. For example, the oxide layer 5010 can have a two-layer structure without the metal oxide layer 5011 or 5013 or may be composed of one of the metal oxide layers 5011 and 5012. Alternatively, the oxide layer 5010 may be constituted by four or more metal oxide layers.

Figure 26B:
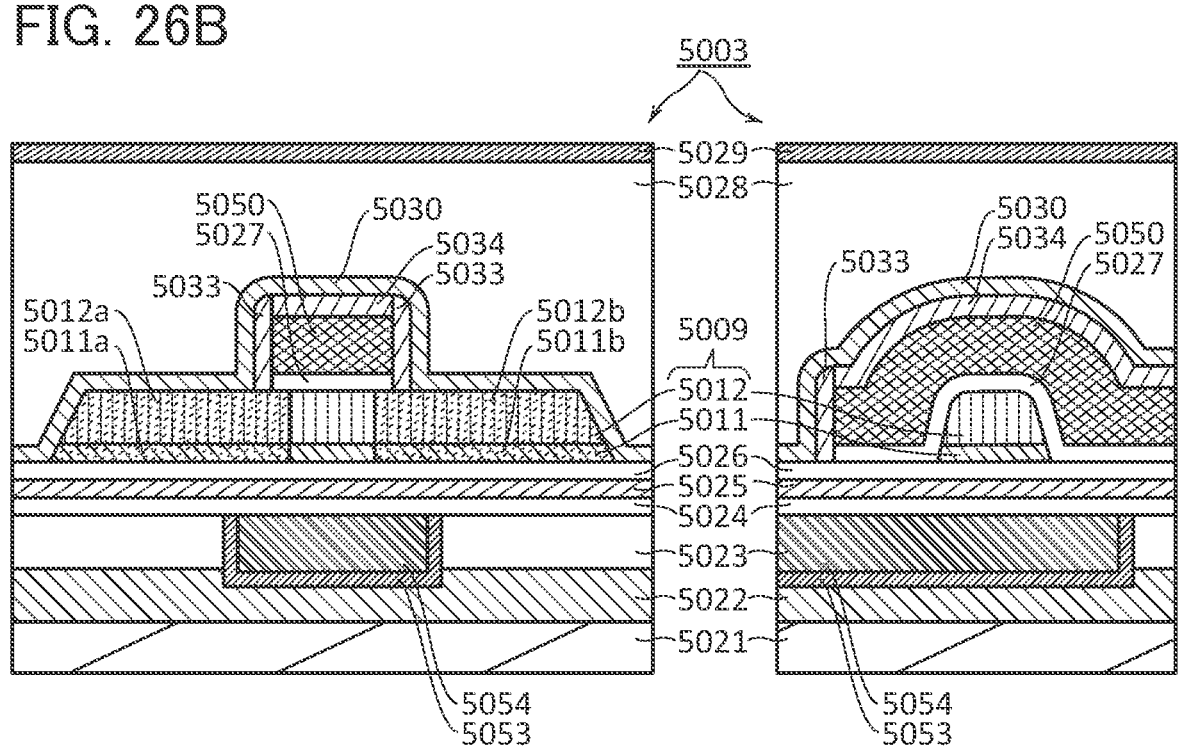

The OS transistor 5003 in FIG. 26B is different from the OS transistor 5001 in the structures of the gate electrode and the oxide layer.

The gate electrode (5050) of the OS transistor 5003 is covered with insulating layers 5033 and 5034. The OS transistor 5003 includes an oxide layer 5009 formed of the metal oxide layers 5011 and 5012. Instead of the conductive layers 5051 and 5052, low-resistance regions 5011a and 5011b are provided in the metal oxide layer 5011, and low-resistance regions 5012a and 5012b are provided in the metal oxide layer 5012. By selectively adding impurity elements (e.g., hydrogen or nitrogen) to the oxide layer 5009, the low-resistance regions 5011a, 5011b, 5012a, and 5012b can be formed.

Adding impurity elements to the metal oxide layer causes formation of oxygen vacancies in the regions to which the impurity elements are added, and the impurity elements enter the oxygen vacancies. This increases the carrier density and thus decreases the resistance of the regions.

<<Metal Oxide>>

A channel formation region of the OS transistor preferably includes a cloud-aligned composite metal oxide semiconductor (CAC-OS).

The CAC-OS has a conducting function in a part of the material and has an insulating function in another part of the material; as a whole, the CAC-OS has a function of a semiconductor. In the case where the CAC-OS or a CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS can have a switching function (on/off function). In the CAC-OS, separation of the functions can maximize each function.

The CAC-OS includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS includes components having different bandgaps. For example, the CAC-OS includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS is used in a channel formation region of a transistor, high current drive capability and high field-effect mobility of the OS transistor can be obtained.

A metal oxide semiconductor is classified into a single crystal metal oxide semiconductor and a non-single-crystal metal oxide semiconductor according to crystallinity. Examples of a non-single-crystal metal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and the like.

The channel formation region of the OS transistor preferably includes a metal oxide including a crystal part, such as a CAAC-OS or an nc-OS.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

In the nc-OS, a microscopic region (for example, a region with a size greater than or equal to 1 nm and less than or equal to 10 nm, in particular, a region with a size greater than or equal to 1 nm and less than or equal to 3 nm) has periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure between those of the nc-OS and the amorphous oxide semiconductor. The a-like OS has a void or a low-density region. The a-like OS has lower crystallinity than the nc-OS and the CAAC-OS.

In this specification and the like, a CAC refers to the function or material of a metal oxide semiconductor, and a CAAC refers to the crystal structure of a metal oxide semiconductor.

REFERENCE NUMERALS 9A, 9B: curve, 10, 11, 20, 21, 22, 23, 24, 25, 171, 172: comparison circuit, 14, 15, 34: differential pair, 17: current source, 18: load circuit, 30, 31, 32, 33, 172A: differential input circuit, 35, 40, 41, 42, 43, 45: output circuit, 38, 39: inverter circuit, 100, 101: negative voltage supply device, 111, 141: control circuit, 112, 117A, 117B, 117C, 123, 142, 153: charge pump circuit, 114: bias voltage generation circuit, 120, 150: output voltage adjuster, 122, 152: negative voltage holding circuit, 127, 154: driver circuit, 128, 155, 161, 162: monitor circuit, 143: divider circuit, 171, 172: comparator circuit, 173: latch circuit, 175, 177: selection circuit, 200, 211, 280: memory device, 210, 261: negative voltage supply device, 215, 281: control circuit, 220, 283: memory cell array, 221, 282: peripheral circuit, 223: row circuit, 224: column circuit, 225: input/output circuit, 230, 231, 232, 233, 234, 235, 236, 237, 238, 240: memory cell, 241, 242, 272: backup circuit, 250: microcontroller unit (MCU), 260: power management unit (PMU), 262: bus, 264, 265: power switch: 265: power switch, 267: level shifter (LS) and buffer circuit, 270: processor core, 271: flip-flop, 272A, 273A: clock buffer circuit, 273: scan flip-flop, 330: CPU core, 340: backup circuit, 400: FPGA, 405: negative voltage supply device, 410: logic array, 411: input/output unit (I/O), 412: clock generator, 413: configuration controller, 414: context controller, 415: row driver, 416: column driver, 421: wiring switch array (RSA), 422: routing switch (RS), 423: switch circuit (SW), 425: logic element (LE), 426: configuration memory (CFM), 428: memory cell, 440: imaging device, 441: negative voltage supply device, 442: control circuit, 443: pixel array, 444: peripheral circuit, 445: row driver, 446: column driver, 448: pixel, 2010: information terminal, 2011, 2031, 3011, 3031: housing, 2012, 2032, 2105: display portion, 2013, 2034, 2101: illuminance sensor, 2015, 2035, 2123, 2141: camera, 2016: operation button, 2017: stylus pen, 2030, 3030: PC, 2036: keyboard, 2100: robot, 2102: microphone, 2103: upper camera, 2104: speaker, 2106: lower camera, 2107: obstacle sensor, 2108: moving mechanism, 2110, 2121: processing device, 2111, 2122: memory device, 2120: flying object, 2121: processing device, 2124: propeller, 2140, 2980: automobile, 2150: guard rail, 5001, 5003: OS transistor, 5009, 5010: oxide layer, 5011, 5012, 5013: metal oxide layer, 5011$a$, 5011$b$, 5012$a$, 5012$b$: low-resistance region, 5021, 5022, 5024, 5027, 5028, 5029, 5030, 5033, 5034: insulating layer, 5050, 5051, 5052, 5053, 5054: conductive layer, 5500: single crystal silicon wafer, 7400: electronic component, 7411: package substrate, 7421: lens cover, 7435: lens, 7440: electronic component, 7441: land, 7451: image sensor chip, 7461: electrode pad, 7471: wiring, 7490: IC chip, BGL, BGL1, BGL2, BGL4, BGL5, CXL, OGL: wiring, BL, BLB: bit line: CK10, CK11, D1, FN40, Q, Qb, Q1, RT, SD, SD_IN, SE, SN1, SN2, SN3, SN11, X1, X2, X5, X6, X11, X12, X13: node, CDL: capacitor line, C11, C21, C22, C25, C40, CS1, CS3, CS5, CS6, CS7: capacitor, IN2, INN, INP, IN_cp, OB, OB1, OB2, OCM, OCMB, OUT2, OUT_cp, OUT3: terminal, MI1, MI2, MI3, MI4, MN1, MN5, MN6, MN7, MO1, MO2, MP3, MO5, MO7, MO11, MO12, MO13, MO14, MO21, MO22, MO25, MP1, MP2, MP5, MP6, MP7, MR1, MT5, MW1, MW2, MW3, MW5, MW6, MW7: transistor, PL2, PL3, V_VDM, V_VSM: power line, RBL: readout bit line, RWL: readout word line, Rd1, Rd2: load, SL: source line, WBL: write bit line, WL: word line, WWL: write word line.

This application is based on Japanese Patent Application Serial No. 2017-107964 filed with Japan Patent Office on May 31, 2017, the entire contents of which are hereby incorporated by reference.

The invention claimed is:

1. A semiconductor device comprising:
a comparison circuit comprising:
a differential input circuit comprising a first transistor and a second transistor,
wherein the first transistor and the second transistor each comprises a first gate and a second gate,
wherein a first input terminal of the comparison circuit is electrically connected to one of the first gate and the second gate of the first transistor,
wherein a second input terminal of the comparison circuit is electrically connected to the first gate of the second transistor,
wherein an output terminal of the comparison circuit is electrically connected to one of a source and a drain of the second transistor,
wherein a first power supply line is electrically connected to the other of the first gate and the second gate of the first transistor, and
wherein a second power supply line is electrically connected to the second gate of the second transistor.

2. The semiconductor device according to claim 1,
wherein a reference voltage is input to the first input terminal, and
wherein a negative voltage is input to the second input terminal.

3. The semiconductor device according to claim 1, wherein a channel formation region of each of the first transistor and the second transistor comprises a metal oxide.

4. The semiconductor device according to claim 1,
wherein the comparison circuit is a dynamic comparison circuit, and
wherein the differential input circuit includes a latch circuit.

5. A semiconductor device comprising:
a comparison circuit comprising:
a differential input circuit comprising a first transistor and a second transistor,
wherein the first transistor and the second transistor each comprises a first gate and a second gate,
wherein a first input terminal of the comparison circuit is electrically connected to one of the first gate and the second gate of the first transistor,
wherein a second input terminal of the comparison circuit is electrically connected to the first gate of the second transistor,
wherein an output terminal of the comparison circuit is electrically connected to one of a source and a drain of the second transistor,
wherein a first power supply line is electrically connected to the other of the first gate and the second gate of the first transistor,
wherein a second power supply line is electrically connected to the second gate of the second transistor, and
wherein a first power supply voltage supplied to the first power supply line and a second power supply voltage supplied to the second power supply line are different from each other.

6. The semiconductor device according to claim 5,
wherein a reference voltage is input to the first input terminal, and
wherein a negative voltage is input to the second input terminal.

7. The semiconductor device according to claim 5, wherein a channel formation region of each of the first transistor and the second transistor comprises a metal oxide.

8. The semiconductor device according to claim 5,
wherein the comparison circuit is a dynamic comparison circuit, and
wherein the differential input circuit includes a latch circuit.

9. The semiconductor device according to claim 5, wherein the first power supply voltage is higher than the second power supply voltage.

* * * * *